United States Patent [19]

Kojima

[11] 4,357,527
[45] Nov. 2, 1982

[54] PROGRAMMABLE DIVIDER

[75] Inventor: Tadashi Kojima, Yokosuka, Japan

[73] Assignee: Tokyo Shibaura Denki Kabushiki Kaisha, Kawasaki, Japan

[21] Appl. No.: 6,490

[22] Filed: Jan. 25, 1979

[30] Foreign Application Priority Data

Jan. 31, 1978 [JP] Japan .................................. 53-9775
Jan. 31, 1978 [JP] Japan .................................. 53-9776
Jan. 31, 1978 [JP] Japan .................................. 53-9777

[51] Int. Cl.³ ............................................ H03K 21/36
[52] U.S. Cl. .......................... 235/92 DM; 235/92 CC; 235/92 PE; 235/92 PL
[58] Field of Search ....... 235/92 DM, 92 PE, 92 CC, 235/92 R, 92 PL; 328/48

[56] References Cited

U.S. PATENT DOCUMENTS

| | | | |
|---|---|---|---|
| 3,230,352 | 1/1966 | Grondin et al. | 235/92 DM |
| 3,538,442 | 11/1970 | Arkell et al. | 235/92 DM |
| 3,840,724 | 10/1974 | Tripp | 235/92 DM |
| 3,937,932 | 2/1976 | Ahlgren | 235/92 DM |
| 4,053,739 | 10/1977 | Miller et al. | 235/92 DM |
| 4,084,082 | 4/1978 | Alfke | 235/92 DM |
| 4,184,068 | 1/1980 | Washburn | 235/92 DM |

Primary Examiner—Joseph M. Thesz
Attorney, Agent, or Firm—Cushman, Darby & Cushman

[57] ABSTRACT

Disclosed is a programmable divider which is provided with high- and low-speed dividers and, and a pulse interval extender. The extender increases or decreases to a predetermined degree the interval or width of pulses divided by the high-speed divider. Then, a dividing ratio of a divider circuit formed of the high- and low-speed dividers and concatenated with each other is varied within one dividing cycle.

20 Claims, 24 Drawing Figures

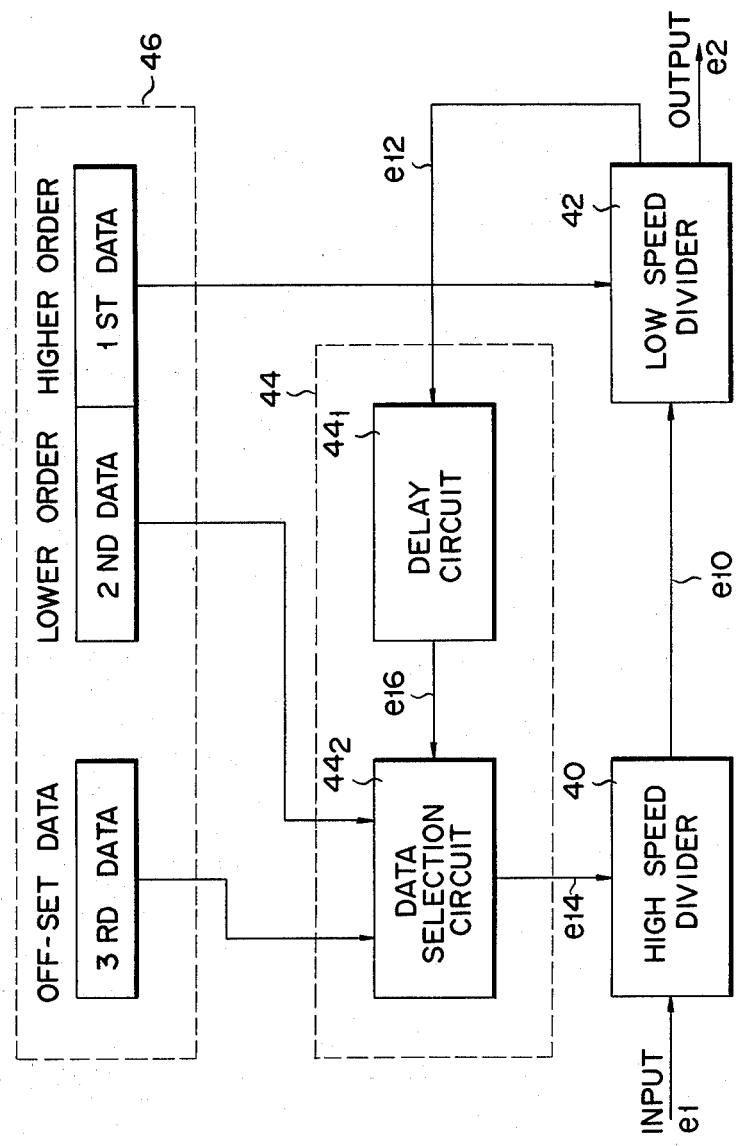
F I G. 3

FIG. 7
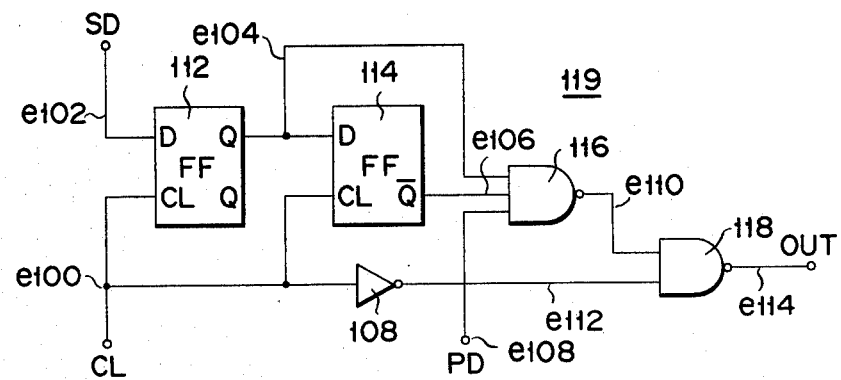
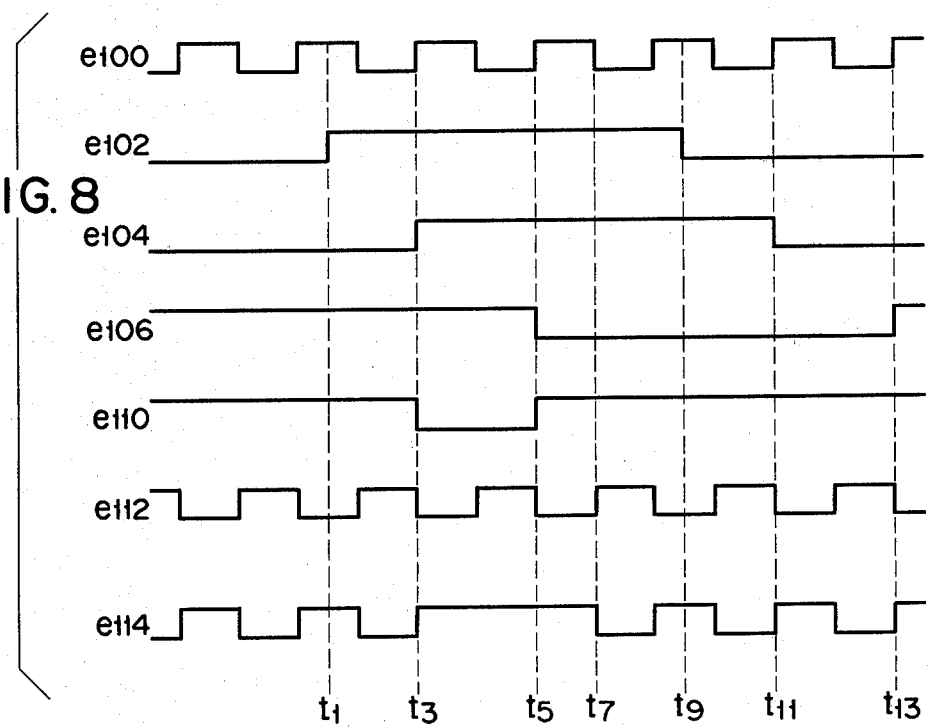
FIG. 8

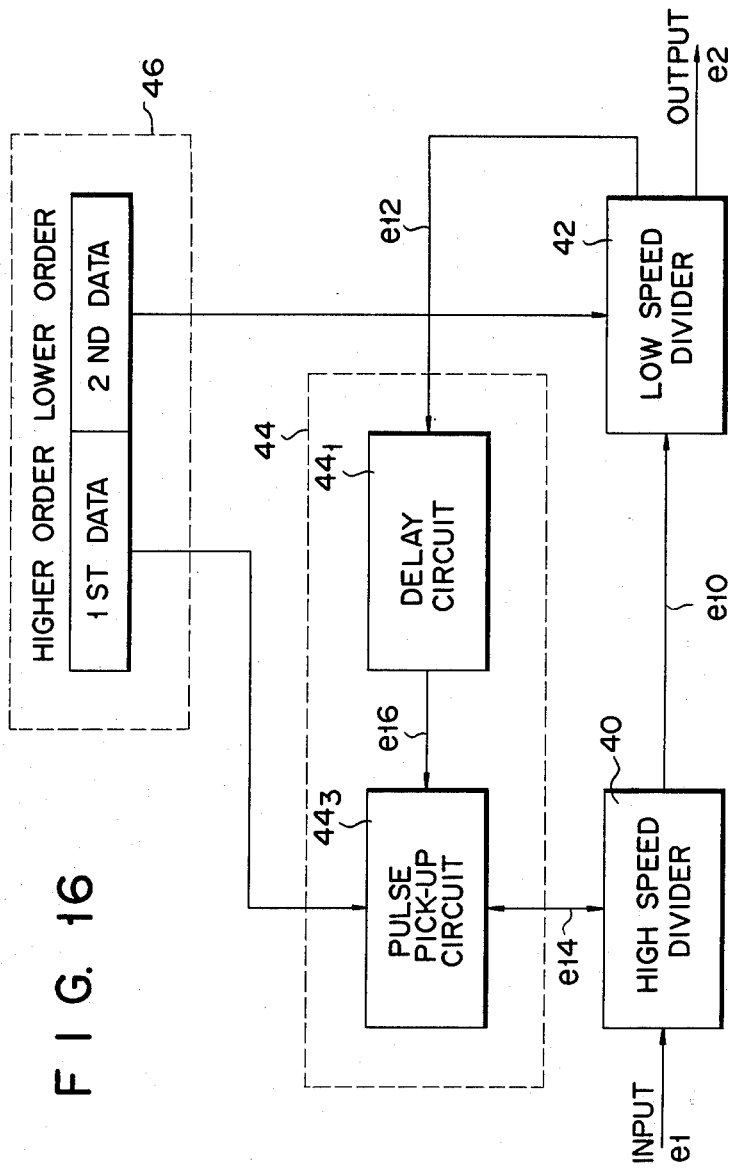
F I G. 16

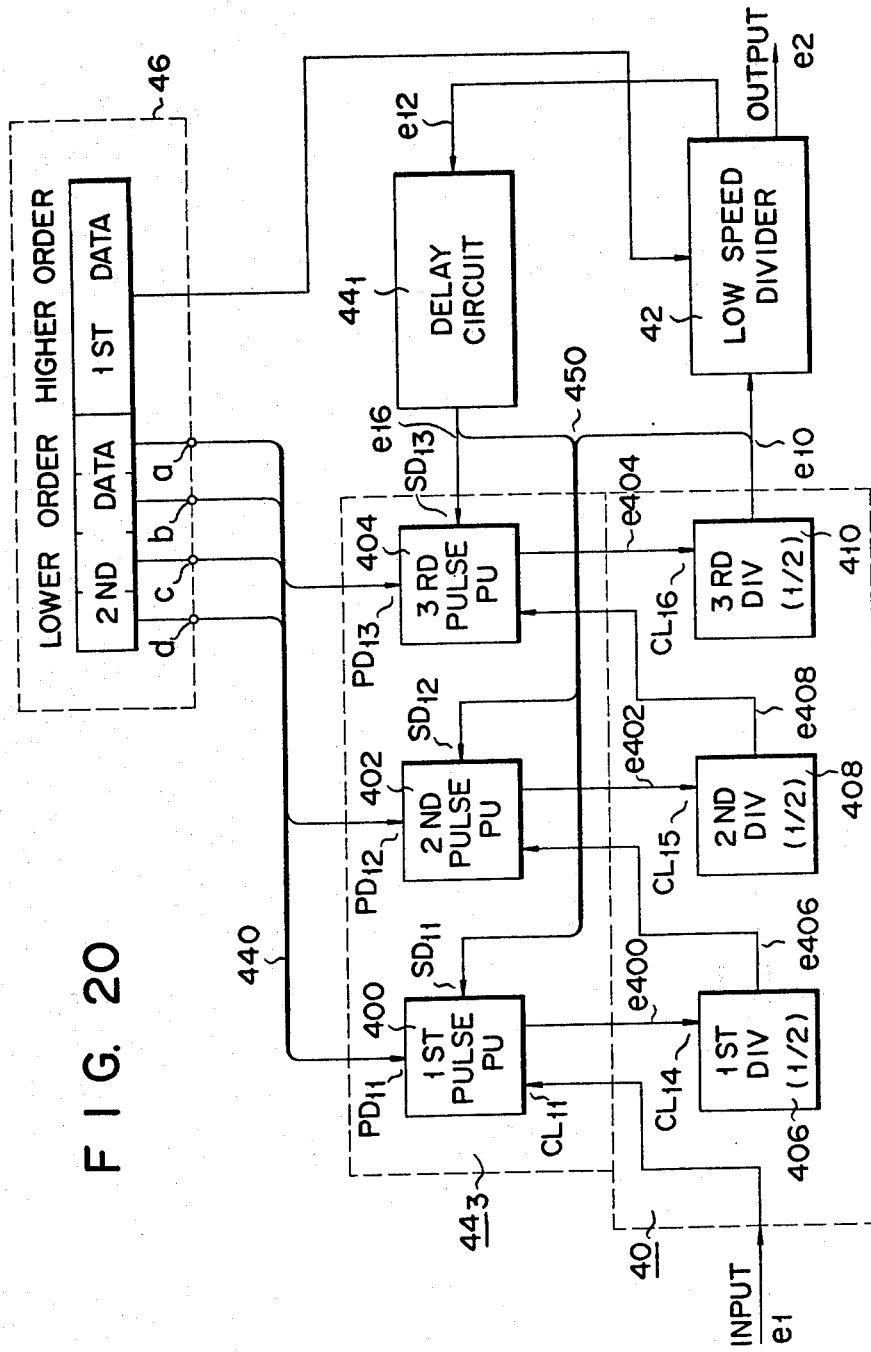
F I G. 20

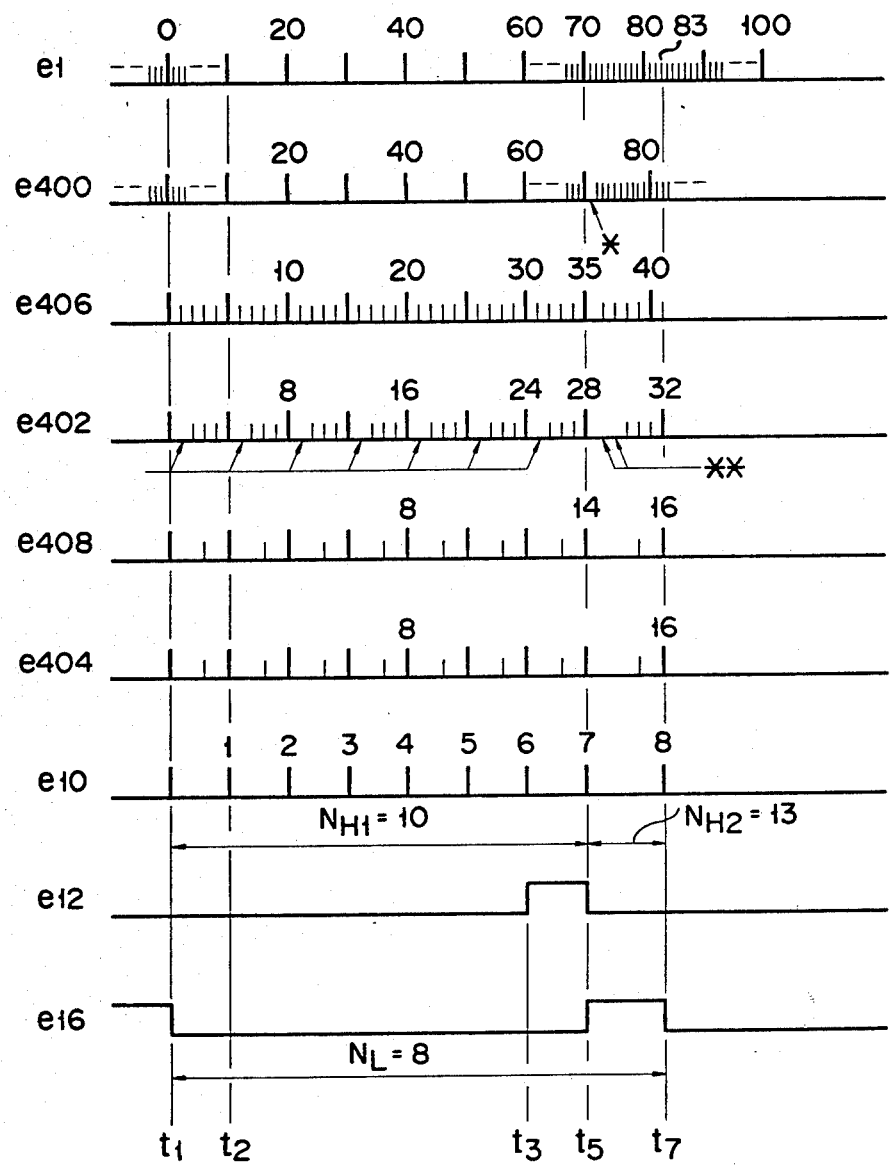

PROGRAMMABLE DIVIDER

This invention relates to a programmable divider of the type used in a frequency synthesizer tuner, etc.

For frequency synthesizer tuners including a phase locked loop, there may be used programmable dividers or counters. A prior art programmable divider employs a system in which a present dividing ratio data is directly counted down. It is, therefore, difficult to raise the upper limit of the frequencies of input signals to be divided, that is, to increase the dividing speed. When applying the conventional programmable divider to an FM-band synthesizer tuner, it is impossible to directly divide the oscillation output of a local oscillator. Accordingly, such conventional dividers require that a frequency converter be interposed between divide ratio data input and the local oscillator. The frequency converter usually employs the beat-down method or prescaler-down method. Such frequency converter, however, produce spurious signals. In order to avoid such spurious signals, the frequency converter has to be shielded and/or a spurious filter must be inserted into antenna circuits. While, the prescaler-down method requires a high dividing ratio, so that the frequency synthesizer would deteriorate in performance.

The object of this invention is to provide a programmable divider capable of high-speed operation.

In order to attain the above object, a programmable divider according to this invention comprises a first divider means having a dividing ratio that may be changed in accordance with a first signal in one dividing cycle, the first divider means being supplied with a second signal to be divided, a second divider means having a second dividing ratio that is determined by a dividing ratio designation data, the second divider means being supplied with a third signal divided by the first divider means, and delivering a divided fourth signal and a fifth signal produced earlier than the fourth signal, and a pulse interval extender means whose pulse interval extension is determined by the dividing ratio designation data, the pulse interval extender means being supplied with the fifth signal to provide timing for pulse interval extending operation thereof, and supplying the first divider means with the first signal which includes a pulse interval extension data based on the dividing ratio designation data and has a timing based on the fifth signal.

In the programmable divider of the aforesaid configuration, the first divider means or high-speed divider can manage most of the dividing operation. The second divider means or low-speed divider is expected only to divide low-frequency signals processed by the high-speed divider. A combination of the high- and low-speed dividers enables the programmable divider to achieve a high-speed operation.

This invention can be more fully understood from the following detailed description when taken in conjunction with the accompanying drawings, in which:

FIG. 3 is a block diagram showing a more specific arrangement as compared with the one shown in FIG. 2;

FIG. 7 is a circuit diagram of a first pulse pick-up circuit 119 as shown in FIG. 6;

FIG. 8 is a timing chart for illustrating the operation of the circuit of FIG. 7;

Figure 6:
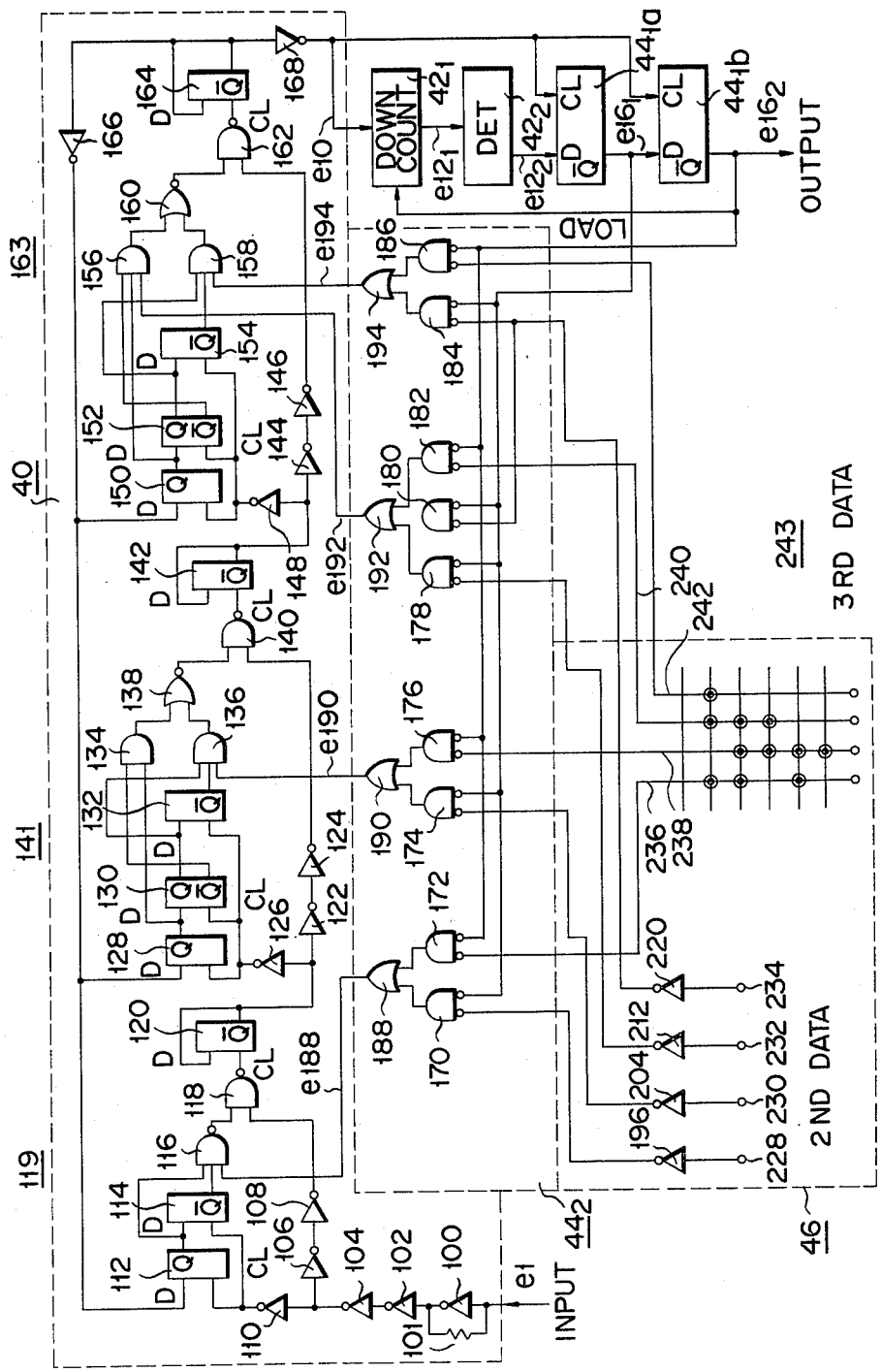
FIG. 6 is a circuit diagram for further detailed illustration of the arrangement of FIG. 5.
Figure 12A:
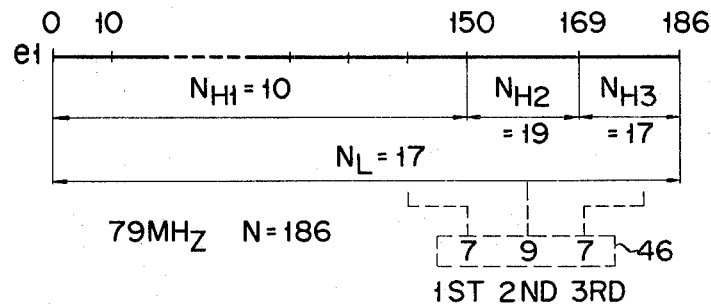
Figure 12B:
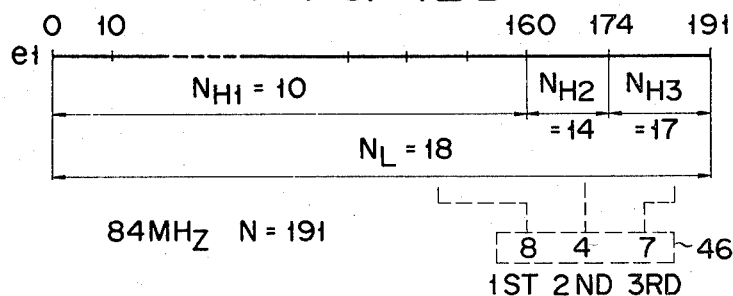
Figure 12C:
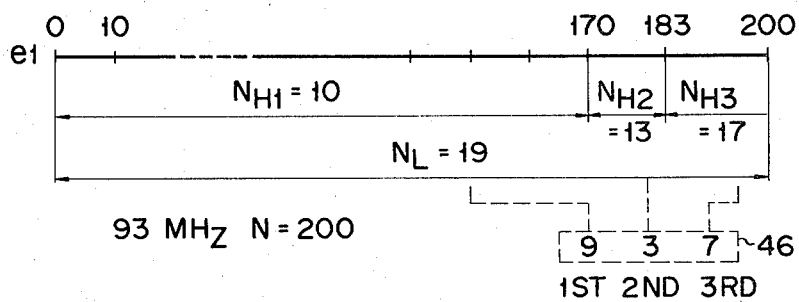
Figure 13:
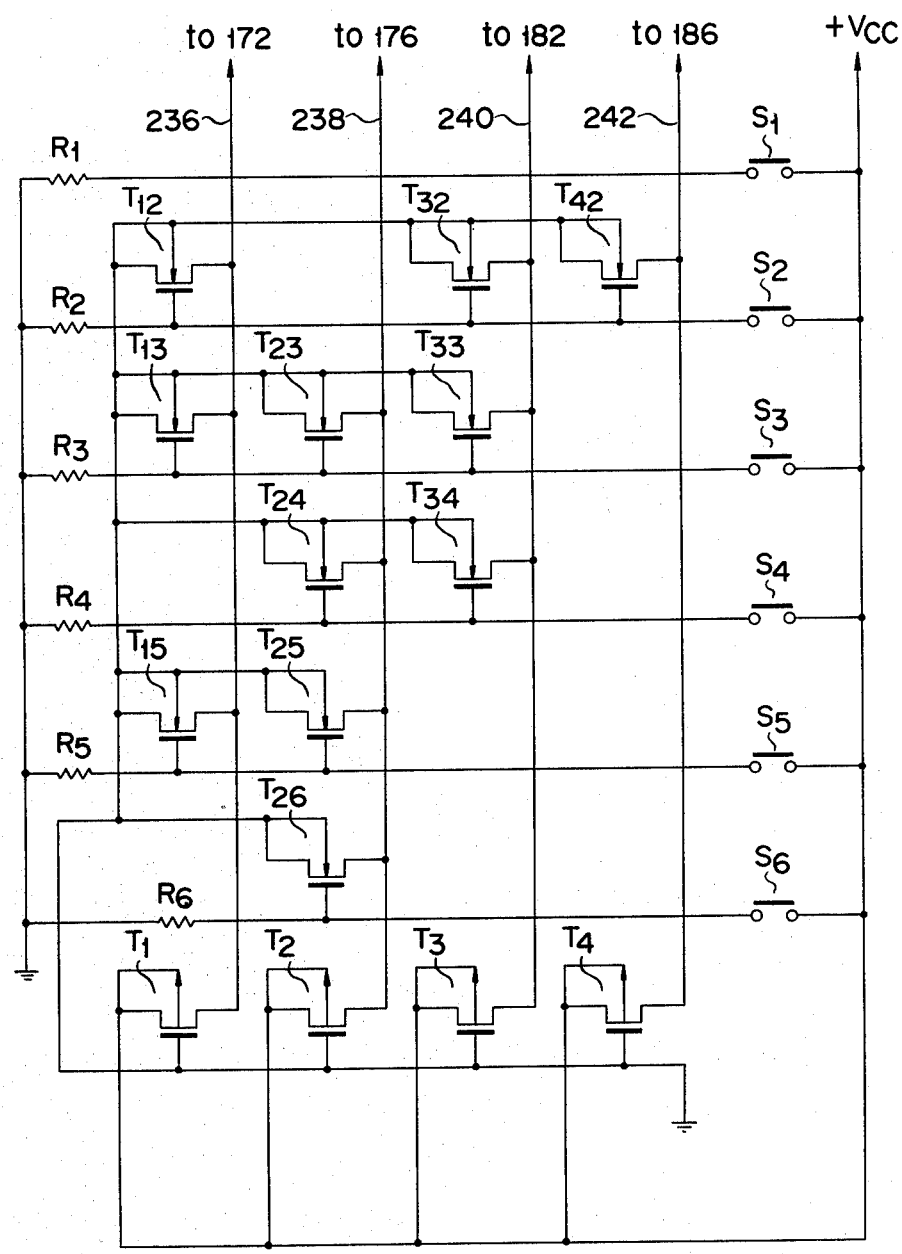
Figure 14:
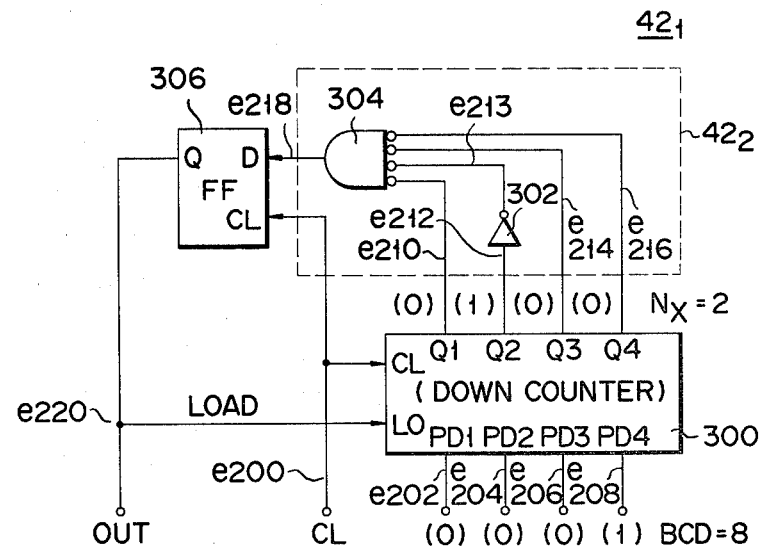
Figure 15:
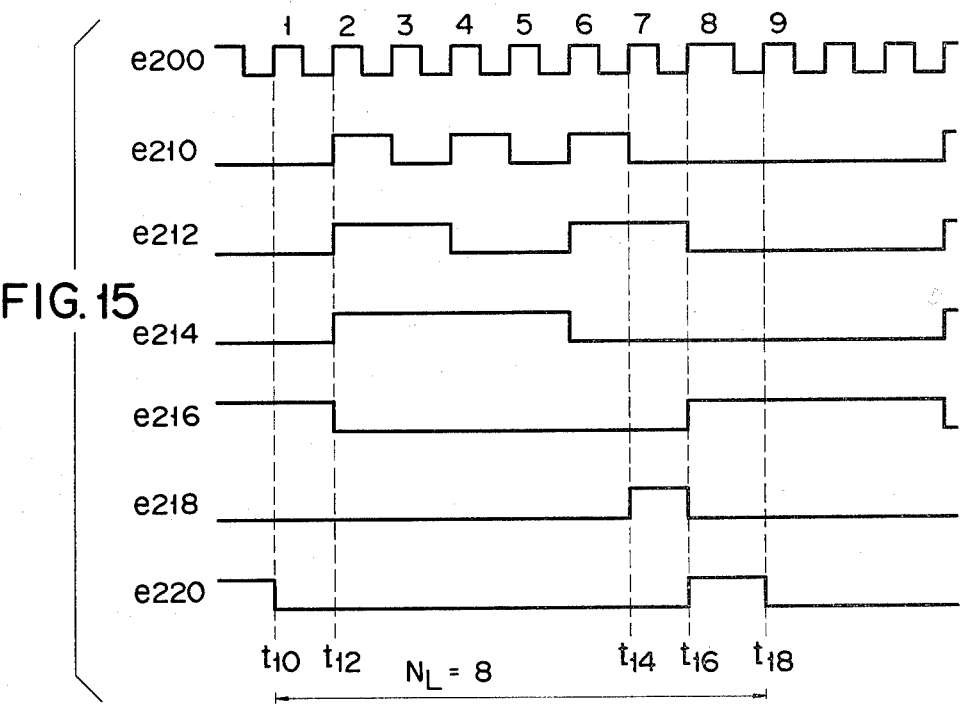
Figure 17:
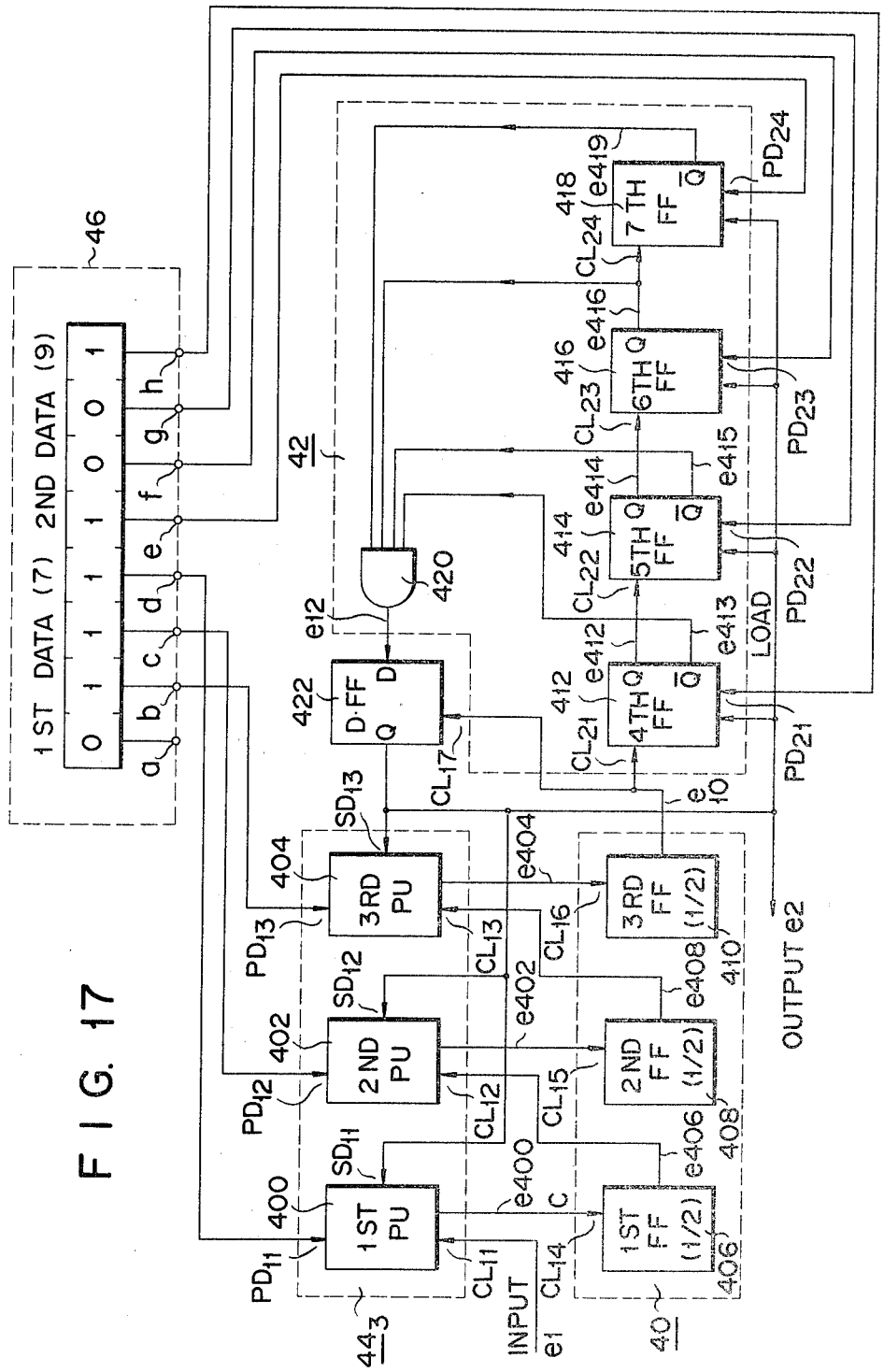
Figure 18:
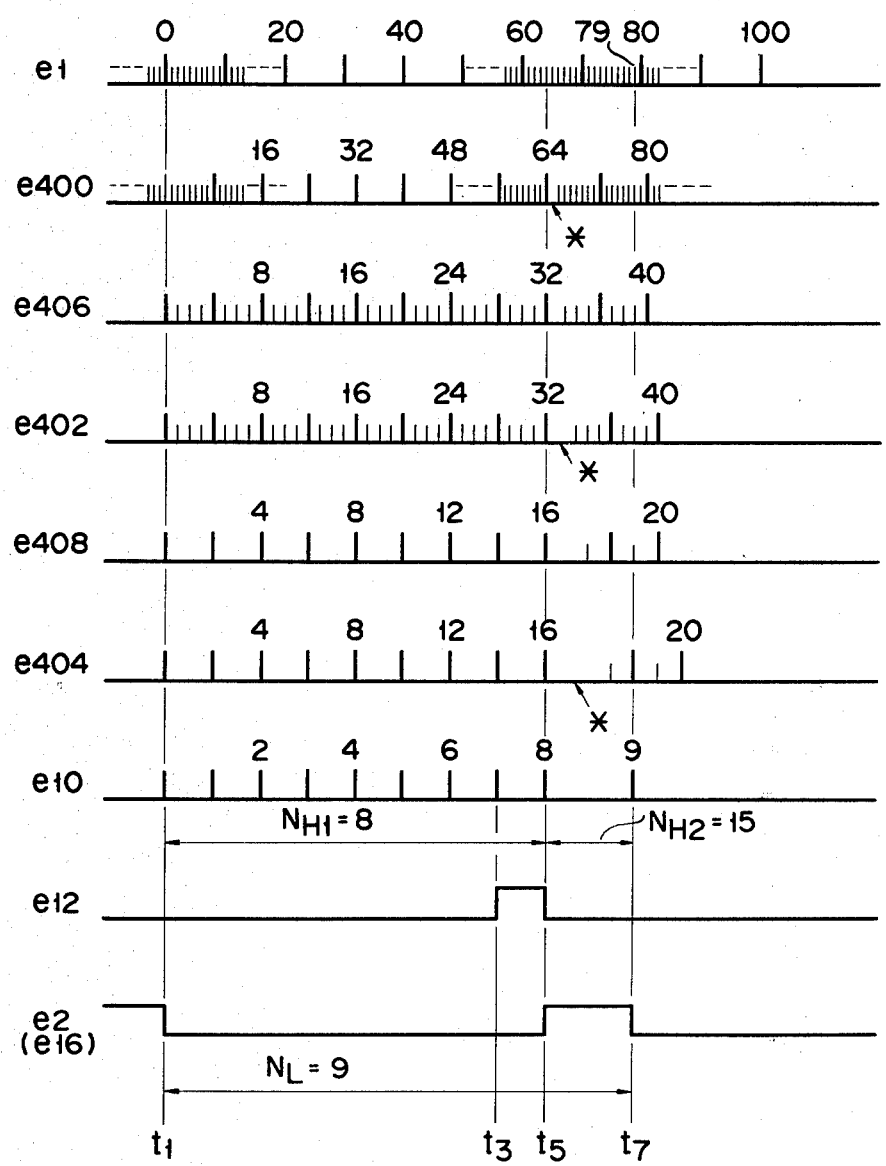
Figure 19:
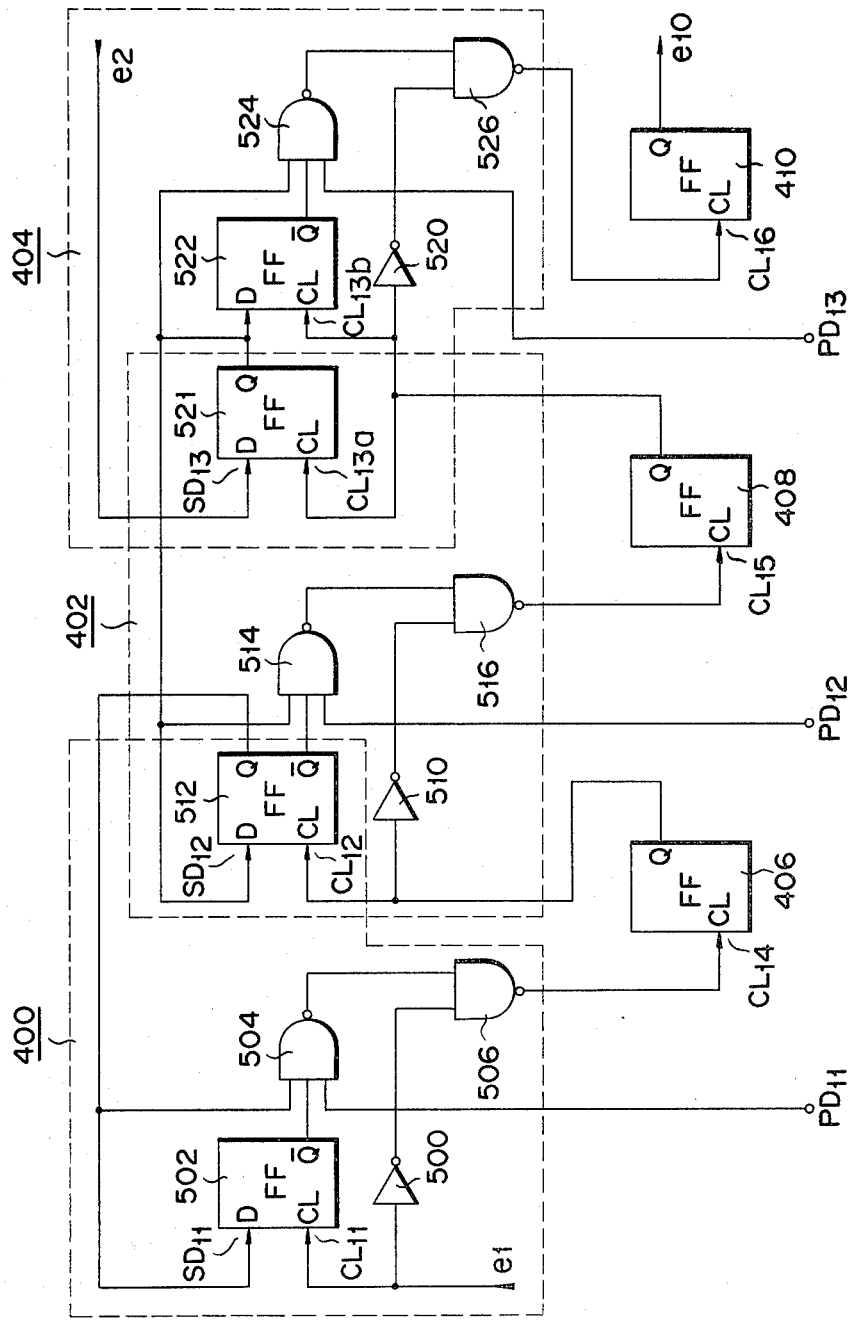
Figure 21:
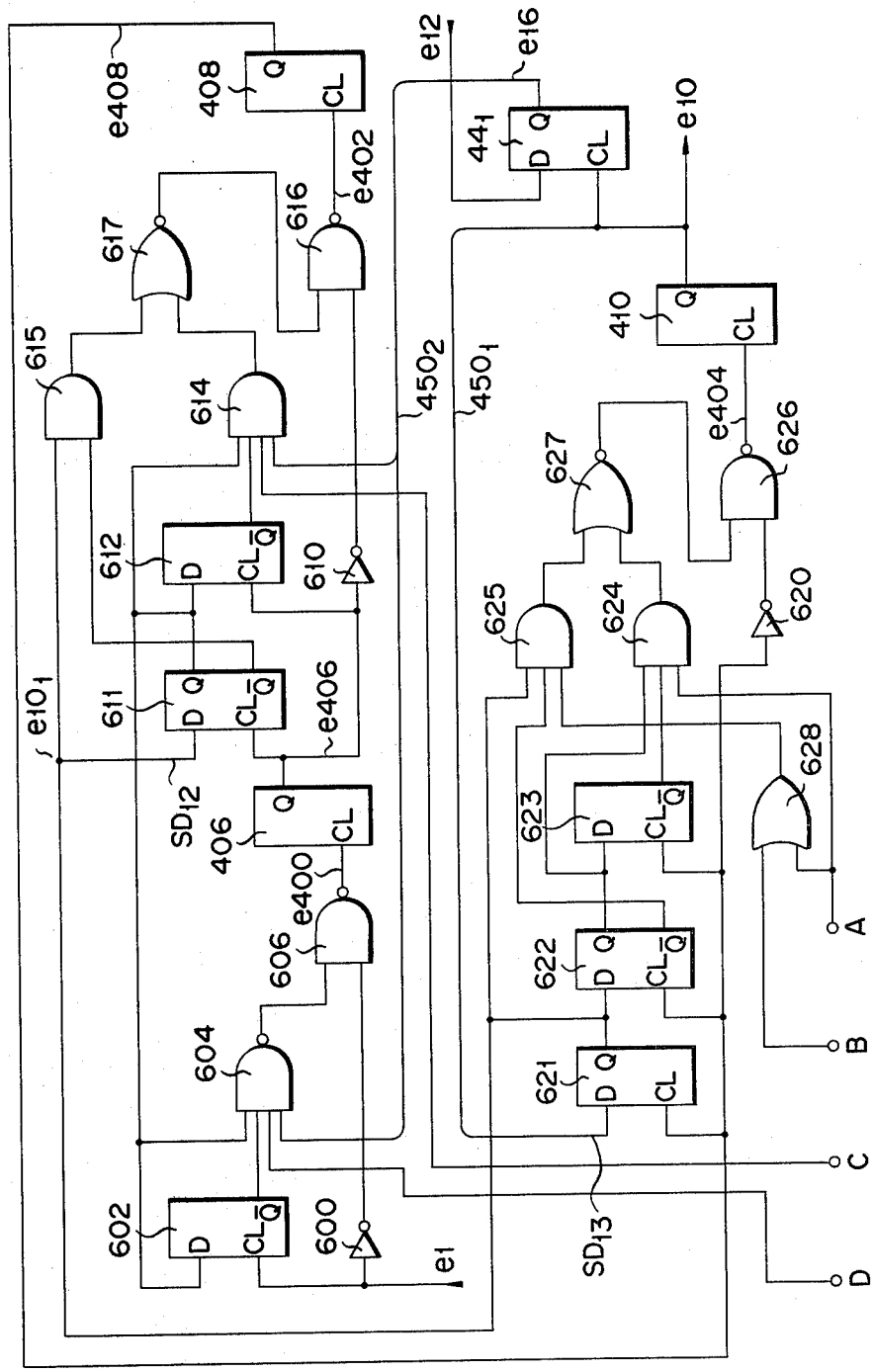

FIGS. 12A to 12C show the correspondence of a dividing ratio designation data 46 to the dividing operations of high- and low-speed dividers 40 and 42;

FIG. 13 is a circuit diagram showing a specific arrangement of a data matrix as shown in FIG. 6;

FIG. 14 is a circuit diagram showing a specific arrangement of a low-speed divider $42_1$ as shown in FIG. 6;

FIG. 15 is a timing chart for illustrating the operation of the circuit of FIG. 14;

FIG. 16 is a block diagram showing a modification of the arrangement as shown in FIG. 3;

FIG. 17 is a circuit diagram for further detailed illustration of the arrangement of FIG. 16;

FIG. 18 is a timing chart illustrating 1/79 dividing operation of a divider having the arrangement as shown in FIG. 17;

FIG. 19 is a circuit diagram showing a pulse pick-up circuit $44_3$ and high-speed divider 40 taken out from the arrangement of FIG. 17;

FIG. 20 is a block diagram showing a modification of the arrangement as shown in FIG. 16 or 17;

FIG. 21 is a detailed circuit diagram showing a pulse pick-up circuit $44_3$ and high-speed divider 40 taken out from the arrangement of FIG. 20; and FIG. 22 is a timing chart illustrating 1/83 dividing operation of a divider having the arrangement as shown in FIG. 21.

Now there will be described preferred embodiments of the programmable divider according to this invention. To avoid repeated description, common or like part are designated by common or like reference numerals.

Figure 1:
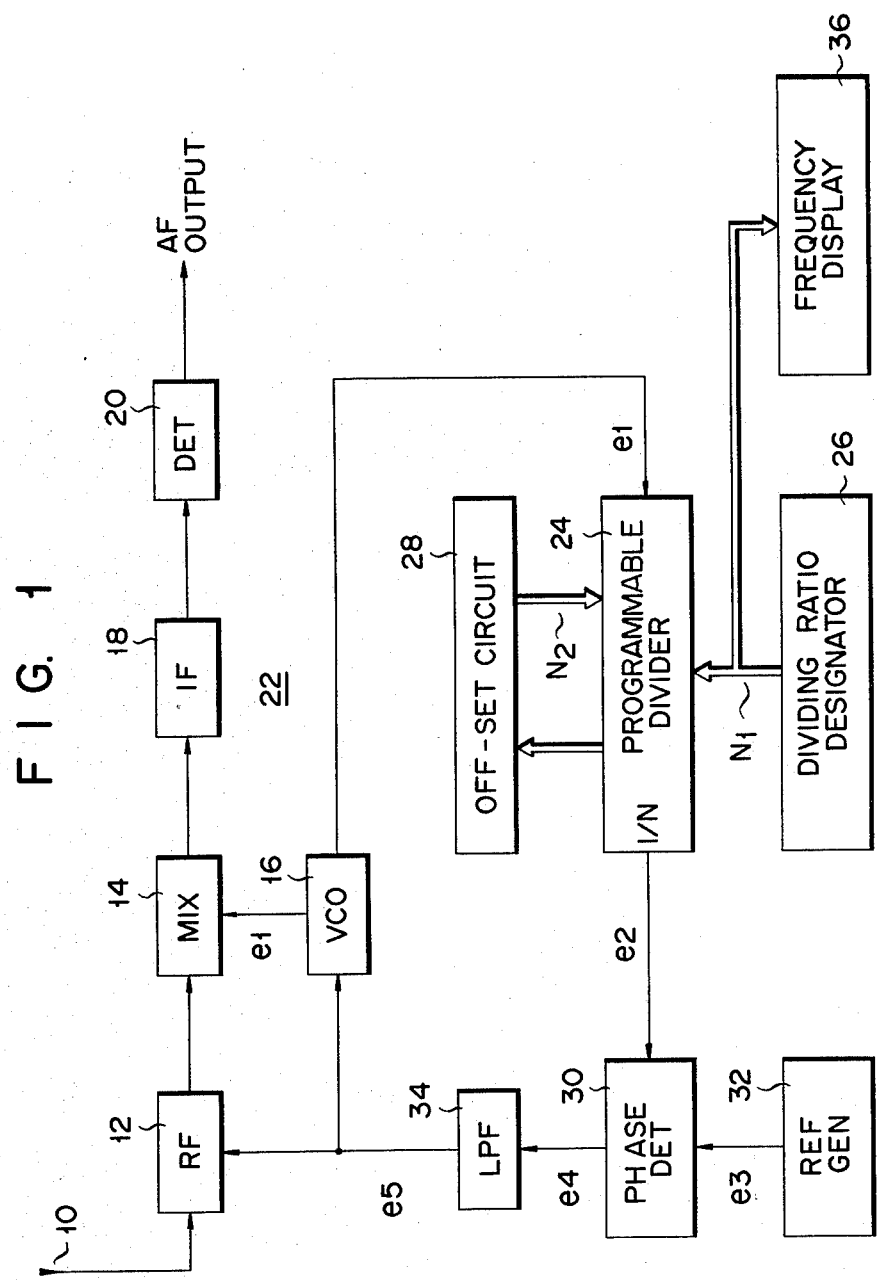
FIG. 1 is a block diagram showing an arrangement of a frequency synthesizer tuner as a typical application of the programmable divider according to this invention.

FIG. 1 is a block diagram showing the configuration of a typical frequency synthesizer tuner.

An antenna 10 receives a radio wave at e.g. 79.0 MHz from an FM broadcasting station. This radio wave is applied to the input of a high frequency amplifier 12, whose output is applied to the input of a mixer 14. The mixer 14 is further supplied with a local signal e1 at 89.7 MHz from a local oscillator or VCO (voltage-controlled oscillator) 16. Then, the mixer 14 supplies an intermediate frequency amplifier 18 with an intermediate frequency signal which has been mixed down to 10.7 MHz. The intermediate frequency signal is amplified by the amplifier 18. The output of the amplifier 18 is demodulated into an audio frequency (AF) signal by a detector 20. The blocks 12 to 20 constitute an ordinary superheterodyne tuner circuit 22.

The local signal or oscillation output signal e1 from the VCO 16 is applied to the input of a programmable divider 24. A dividing ratio N of the divider 24 is determined by a dividing ratio designator 26 and an offset circuit 28. For example, a first dividing ratio N1=790 is designated by the designator 26, while a second dividing ratio N2=107 is designated by the circuit 28. Thereupon, the dividing ratio N is N=N1+N2=897. Namely, the dividing ratio N of 897 is programmed into the divider 24. The divider converts the signal e1 at a frequency of 89.7 MHz into a divided signal e2 by 1/897. That is, the frequency of the signal e2 becomes 0.1 MHz.

The signal e2 is applied to the input of a phase detector 30. The detector 30 is further supplied with a reference signal e3 from a reference signal generator 32, the frequency of the signal e3 being 0.1 MHz. At the detector 30, the frequency and phase of the signal e2 are compared with those of the signal e3. Thus, the detector 30 delivers the frequency-phase difference between the signals e2 and e3 as a detection output signal e4. The signal e4 is converted into a control voltage signal e5 by a low-pass filter (LPF) 34. The voltage signal e5 is supplied to the amplifier 12 and the VCO 16.

The blocks 16, 24, 30, 32 and 34 form a PLL (phase locked loop) which operates so as to reduce the frequency-phase difference between the signals e2 and e3 to zero. By such operation of the PLL, the tuning frequency of the tuner circuit 22 is locked at 79.0 MHz. At this time, the first dividing ratio N1 for the divider 24 is 790. The first dividing ratio N1=790 is delivered to a frequency display 36, where the tuning frequency of 79.0 MHz is displayed. On the other hand, the second dividing ratio N2=107 corresponds to the intermediate frequency 10.7 MHz of the tuner circuit 22. If the second dividing ratio N2=107 is given by the offset circuit 28, the value of the first dividing ratio N1 given by the designator 26 will directly corresponds to the tuning frequency.

According to the aforesaid example, the divider 24 must divide the signal e1 at 89.7 MHz. Technically, it is very hard to produce a programmable divider that can divide such a high frequency signal directly into 1/897. However, such difficulty may be eliminated by separating this divider into two - high- and low-speed dividers.

Figure 2:
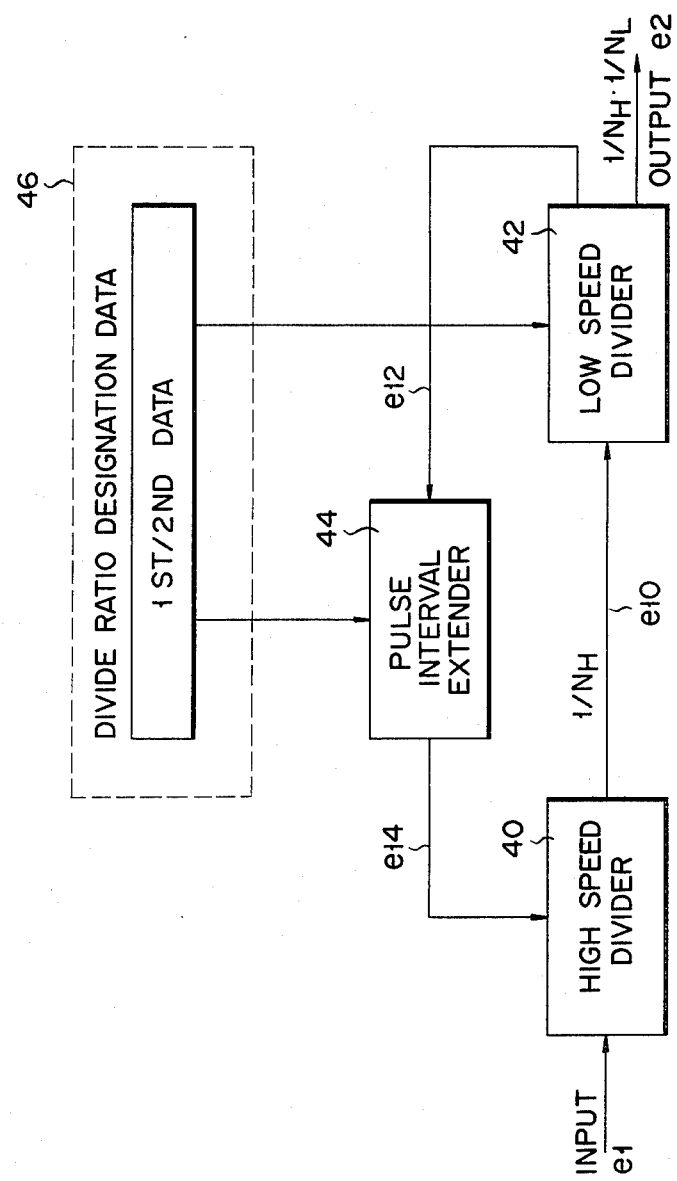
FIG. 2 is a block diagram showing the basic arrangement of the programmable divider of the invention.

FIG. 2 shows the basic arrangement of the programmable divider according to this invention. An input signal e1 to be divided is applied to the signal input of a high-speed divider 40 having a divide ratio $N_H$. The high-speed divider 40 is, preferably, a decimal or binary counter, top priority being given to high-speed operation. In the divider 40, any complicated change of the dividing ratio is not made, but the interval of the divided signal pulse is extended at times. The pulse interval extension is made by temporarily changing a dividing ratio $N_H$ of the divider 40 or pulse pick-up as mentioned later.

A signal $e10 = e1/N_H$ from divider 40 is applied to the input of a low-speed divider 42 having a divide ratio $N_L$. The divider 42 is, preferably, a presettable down counter, top priority being given to dividing ratio change. At the divider 42, the signal e10 from divider 40 is further divided by $N_L$. An output signal e2 of the divider 42 is equal to e1/N as where the dividing ratio N is given by $N=N_H \cdot N_L$. An optional dividing ratio N cannot, however, be obtained by changing only the dividing ratio $N_L$. If $N_L$ is changed one by one where $N_H=10$, for example, $N=N_H \cdot N_L$ will change by tens. Although in this case N=890 and N=900 may be set, N=891 to 899 may not.

In order to overcome this limitation, according to this invention, the dividing ratio $N_H$ is modified before one-time dividing period is completed. For example, let us assume that division by 897 is desired where the divider 40 is a decimal counter ($N_H=10$) and the divider 42 is a down counter with $N_L=89$ programmed therein. The dividing ratio $N_L=89$ is given by a dividing ratio designation data 46. The dividing ratio $N_H$ is 10 before the input signal e1 is divided up to 880 pulses. The signal e10 will be produced for 88 pulses by the time the signal e1 is divided up to 880 pulses. Thereupon, the current number in the down counter 42 is "1". This number "1" is delivered as a timing signal e12 from the divider 42 to a pulse interval extender 44. When the timing signal e12 at "1" is detected by the extender 44, an instruction signal e14 for pulse interval extension is supplied from the extender 44 to the divider 40. The content of the instruction signal e14, that is, the pulse interval extension number is given by the designation data 46.

When the instruction signal e14 is applied to the divider 40, the dividing ratio $N_H$ is extended from 10 to 17. Then, the pulse number of the signal e1 is changed from "88" to "89" by 17 pulses of the signal e1 from 881 to 897. After signal e10 has provided 89 pulses to divider 42, the current number therein becomes "0". Then, the signal e2 of 1 pulse is delivered from the counter 42. The moment such delivery is finished, the content of the counter 42 is reset to "89". By these operations, the output signal e2 of 1 pulse is obtained for 897 pulses of the input signal e1.

The dividing ratio $N_L$ of the down counter or low-speed divider 42 is determined by the dividing ratio designation data 46. The designation data 46 is divided into two - first and second data. Let it be supposed that the first and second data are "8" and "9" respectively, for example. In this case, the dividing ratio $N_L$ of the divider 42 is given as "89". Further, the pulse interval extension number instructed for by the extender 44 is given as "7". This extension number "7" may be set by synthesizing it from the first and second data or by newly providing a third data.

FIG. 3 is a block diagram showing a more specific arrangement than the one shown in FIG. 2. Described here is a case where the dividing ratio N is changed into 186 and the dividing ratio designation data 46 is divided into three - first, second and third data. The first and second data correspond to a first dividing ratio N1 representing the received frequency of the tuner, while the third data corresponds to a second dividing ratio N2 for offsetting. A timing signal e12 derived from a low-speed divider 42 is applied to the input of a delay circuit $44_1$. A delay signal e16 is delivered from the delay circuit $44_1$ to a data selection circuit $44_2$. The selection circuit $44_2$ is supplied with the third and second data from the designation data 46. The selection circuit $44_2$ supplies a high-speed divider 40 which an instruction signal e14 corresponding to the signal e16.

When the signal e16 is not being produced, the selection circuit $44_2$ supplies the divider 40 with an instruction signal e14=0. At this time, a dividing ratio $N_H$ of the divider 40 makes no change. If the divider 40 is a decimal counter, for example, $N_H=10$ will be obtained. Subsequently, when a first delay signal $e16_1$ is produced, the selection circuit $44_2$ selects the second data. Here let it be assumed that the second data is "9", for example. Then, an instruction signal $e14_1=9$ is supplied to the divider 40, so that the dividing ratio $N_H$ is changed from "10" to "19". Thereafter, when the signal $e16_1$ has disappeared to produce a second delay signal $e16_2$, the selection circuit $44_2$ selects the third data. Here let it be assumed that the third data is "7", for example. Then, an instruction signal $e14_2=7$ is supplied to the divider 40, so that the dividing ratio $N_H$ is changed from "19" to "17".

A signal e10 divided by the divider 40 is supplied to the divider 42. A dividing ratio $N_L$ of the divider 42 is changed correspondingly to the first data of the designation data 46. Let us suppose that the divider 42 is a programmable down counter and a dividing ratio number "10" is always set where the first data is "7", for example. Then, "17" is programmed into the divider 42 at the initial stage of one dividing cycle. That is, the dividing ratio $N_L$ of the divider 42 is set at "17".

Figure 4:
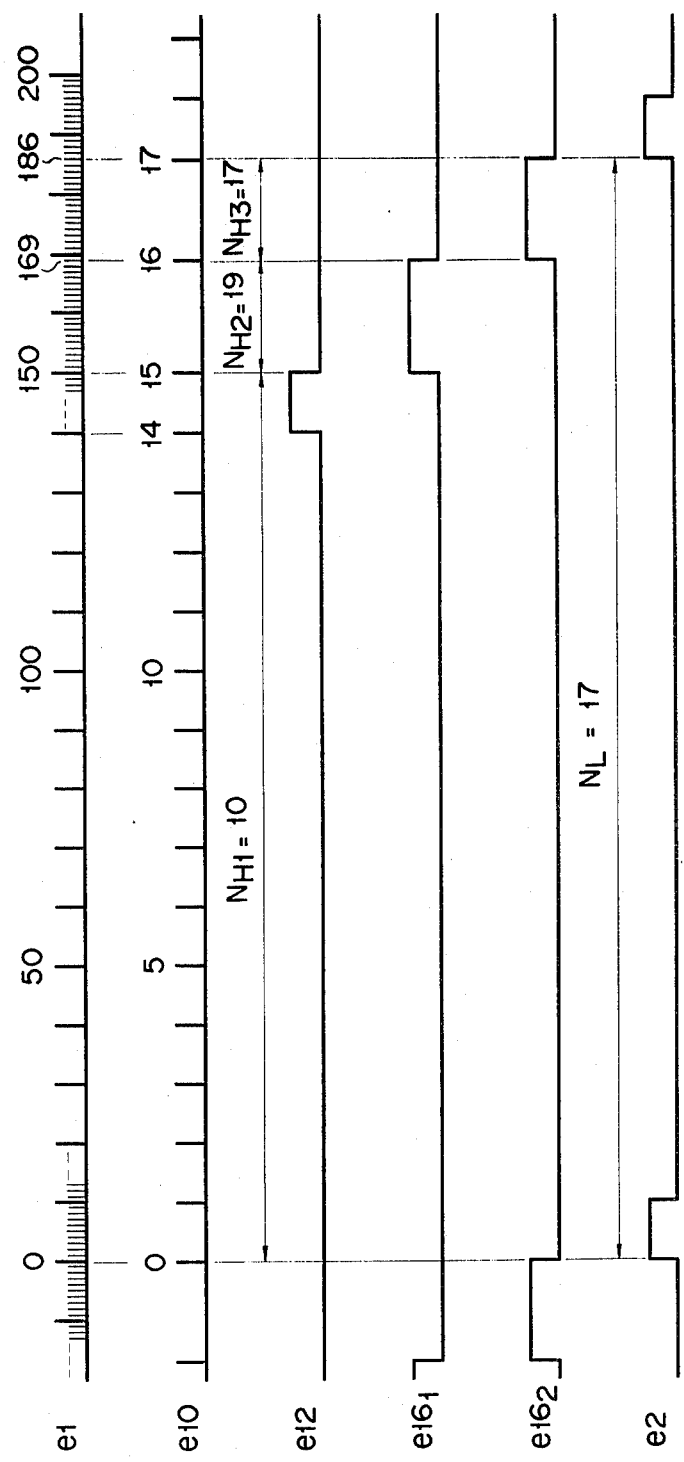
FIG. 4 is a timing chart illustrating 1/186 dividing operation of a divider having the arrangement as shown in FIG. 3.

FIG. 4 is a timing chart illustrating the dividing operation of a divider having the configuration as shown in FIG. 3. In one dividing cycle, a dividing ratio $N_{H1}$ of the divider 40 is "10" until a 150th pulse of an input signal e1 is produced. A timing signal e12 is produced when a signal e10 divided by the divider 40 is produced up to 14 pulses. The signal e12 is converted by the delay circuit $44_1$ into a first delay signal $e16_1$ delayed by 1 pulse. That is, the signal $e16_1$ develops at a point of time when the signal e10 is produced up to 15 pulses. A dividing ratio $N_{H2}$ of the divider 40 is changed into "19" by the signal $e16_1$. Then, a 16th pulse of the signal e10 develops when a 169th pulse of the signal e1 is produced. When the 16th pulse of the signal e10 is produced, the signal $e16_1$ is converted into a second delay signal $e16_2$ which is delayed by 1 pulse. A dividing ratio $N_{H3}$ of the divider 40 is changed into "17" by the signal $e16_2$. Then, a 17th pulse of the signal e10 develops when a 186th pulse of the signal e1 is produced. The counter 42 is so set as to be a 17th scale down counter. Accordingly, the counter 42 delivers one output signal e2 when the 17th signal e10 or the 186th signal e1 is produced. Both the signals $e16_2$ and e2 are obtained by dividing the input signal e1 into 1/186. Thus, a delay signal e16 derived from the delay circuit $44_1$ may be used in place of the output signal e2 of the low-speed divider 42.

Figure 5:
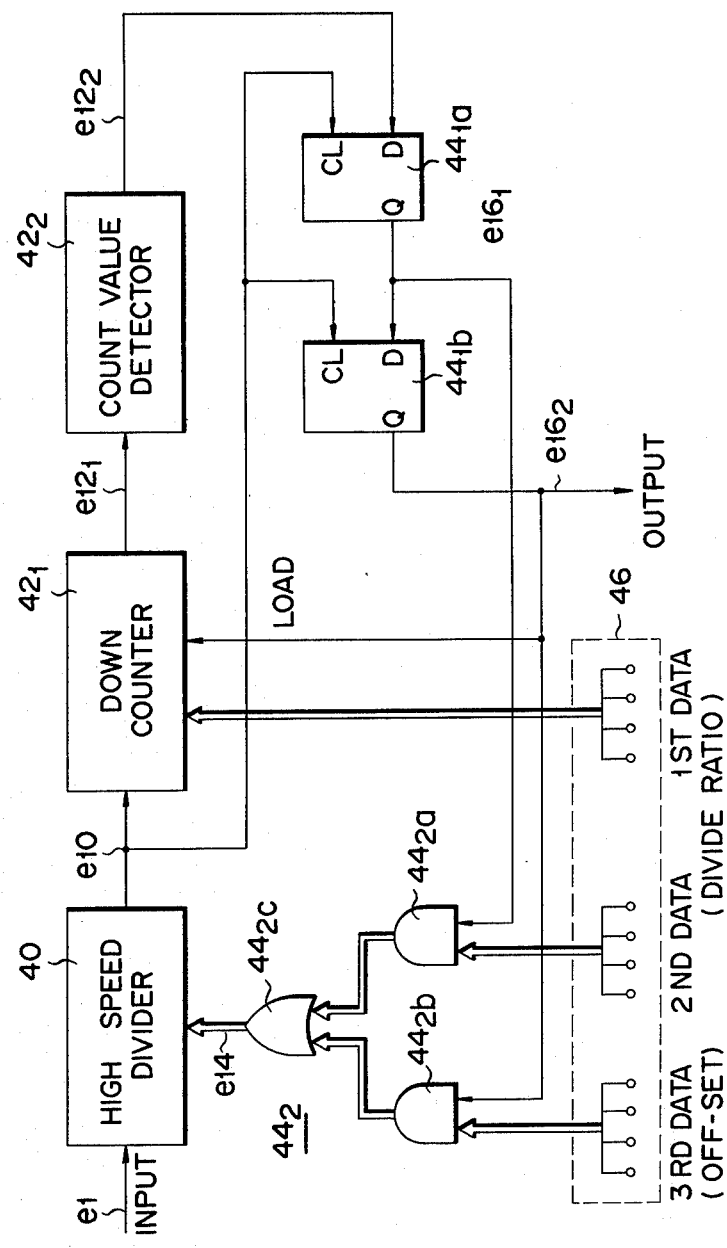
FIG. 5 is a block diagram showing a further specific arrangement as compared with the one shown in FIG. 3.

FIG. 5 is a block diagram showing a further specific arrangement as compared with the one shown in FIG. 3. A signal e10 divided by a high-speed divider 40 is applied to the input of a down counter $42_1$, and also supplied to clock input terminals CL of D-type flip-flops(D-FF) $44_{1a}$ and $44_{1b}$. An output signal $e12_1$ of the counter $42_1$ is applied to the input of a count value detector $42_2$. The detector $42_2$ supplies one timing signal $e12_2$ to the D-terminal of the FF $44_{1a}$ when the output state of the signal $e12_1$ gets at "3". The signal $e12_2$ corresponds to the signal e12 as shown in FIG. 3. If the signal $e12_1$ is represented by a BCD code, the detector $42_2$ can be formed of an AND circuit to detect a 4-bit code "0011". When the counter $42_1$ has its numerical content counted down to "3" in BCD code, a logic level "1" of the signal $e12_2$ is applied to the D-terminal of the FF $44_{1a}$. Subsequently, when the signal e10 is produced at the clock input terminal CL of the FF $44_{1a}$, a first delay signal $e16_1$ is supplied from an output terminal Q of the FF $44_{1a}$ to the D-terminal of the FF $44_{1b}$.

The signal $e16_1$ is applied to the input of an AND gate $44_{2a}$, which is supplied also with a second data "9". When the AND gate $44_{2a}$ is opened by the signal $e16_1$, the second data "9" is supplied as an instruction signal $e14_1$ to the divider 40 through an OR gate $44_{2c}$. Then, a dividing ratio $N_H$ of the divider 40 is changed from $N_{H1}=10$ to $N_{H2}=19$. Thereafter, when the signal e10 is produced at the clock input terminal CL of the FF $44_{1b}$, a second delay signal $e16_2$ is delivered from an output terminal Q of the FF $44_{1b}$. The signal $e16_2$ is applied to the input of an AND gate $44_{2b}$, which is supplied also with a third data "7". Since the production of the signal $e16_2$ causes the signal $e16_1$ to die away, the AND gate $44_{2a}$ is then closed. When the AND gate $44_{2b}$ is opened by the signal $e16_2$, the third data "7" is supplied as the instruction signal $e14_1$ to the divider 40 through the OR gate $44_{2c}$. Then, the dividing ratio $N_H$ of the divider 40 is changed from $N_{H2}=19$ to $N_{H3}=17$.

The signal $e16_2$ is utilized as an output signal e2 of a low-speed divider 42. Although in FIG. 3 the output signal e2 is taken out from the low-speed divider 42, an output signal e16 divided up to a desired number of pulses may also be obtained from the delay circuit $44_1$. By the signal $e16_2$, the down counter $42_1$ is reprogrammed at "17" which equals a first data "7" plus "10". The first and second data "7" and "9" are directly used for the display of a frequency "79". A number "107" obtained by adding "100" to the third data "7" corresponds to the second dividing ratio N2 or offset data "107" described before with reference to FIG. 1.

FIG. 6 is a circuit diagram for further detailed illustration of the configuration of FIG. 5. An input signal e1 is connected to a second input terminal of a NAND gate 118 through series-connected inverters 100 to 108. The input and output terminals of the inverter 100 are connected with each other through a resistor 101. The output terminal of the inverter 104 is connected to the clock input terminals of D-FF's 112 and 114 through an inverter 110. An output terminal Q of the FF 112 is connected to the D-input terminal of the FF 114 and a first input terminal of a NAND gate 116. An output terminal $\overline{Q}$ of the FF 114 is connected to a second input terminal of the NAND gate 116. The output terminal of the NAND gate 116 is connected to a first input terminal of the NAND gate 118. The FF's 112 and 114 and the NAND gates 116 and 118 constitute a first pulse pick-up circuit 119.

The output of the NAND gate 118 is connected to the clock input terminal of a D-FF 120. The D-input terminal of the FF 120 is connected to an output terminal $\overline{Q}$ of the same FF. The FF 120 forms a binary counter or ½ divider.

The output terminal $\overline{Q}$ of the FF 120 is connected to a second input terminal of a NAND gate 140 via series-connected inverters 122 and 124. The output terminal $\overline{Q}$ of the FF 120 is connected also to the respective clock input terminals of D-FF's 128, 130 and 132 through an inverter 126. An output terminal Q of the FF 128 is connected to the D-input terminal of the FF 130 and a second input terminal of an AND gate 134. A first input terminal of the AND gate 134 is connected to an output terminal $\overline{Q}$ of the FF 130. An output terminal Q of the FF 130 is connected to the D-input terminal of the FF 132 and a first input terminal of an AND gate 136. The output terminal $\overline{Q}$ of the FF 132 is connected to a second input terminal of the AND gate 136. The output terminals of the AND gates 134 and 136 are connected to first and second input terminals of a NOR gate 138 respectively. The output terminal of the NOR gate 138 is connected to a first input terminal of the NAND gate 140. The FF's 128, 130 and 132, the AND gate 134 and 136, the NOR gate 138, and the NAND gate 140 constitute a second pulse pick-up circuit 141.

The output terminal of the NAND gate 140 is connected to the clock input terminal of a D-FF 142. The D-input terminal of the FF 142 is connected to an output terminal $\overline{Q}$ of the same FF. The FF 142 is used as a ½ divider.

The output terminal $\overline{Q}$ of the FF 142 is connected to a second input terminal of a NAND gate 162 via series-connected inverters 144 and 146. The output terminal $\overline{Q}$ of the FF 142 is connected further to the respective clock input terminals of D-FF's 150, 152 and 154 through an inverter 148. An output terminal Q of the FF 150 is connected to the D-input terminal of the FF 152 and a second input terminal of an AND gate 156. A first input terminal of the AND gate 156 is connected to an output terminal $\overline{Q}$ of the FF 152. An output terminal Q of the FF 152 is connected to the D-input terminal of the FF 154 and a first input terminal of an AND gate 158. An output terminal $\overline{Q}$ of the FF 154 is connected to a second input terminal of the AND gate 158. The output terminals of the AND gates 156 and 158 are connected to first and second input terminals of a NOR gate 160 respectively. The output terminal of the NOR gate 160 is connected to a first input terminal of the NAND gate 162. The FF's 150, 152 and 154, the AND gates 156 and 158, the NOR gate 160, and the NAND gate 162 constitute a third pulse pick-up circuit 163.

The output terminal of the NAND gate 162 is connected to the clock input terminal of a D-FF 164. The D-input terminal of the FF 164 is connected to an output terminal $\overline{Q}$ of the same FF. The FF 164 is a ½ divider. The output terminal $\overline{Q}$ of the FF 164 is connected to the respective D-input terminals of the FF's 150, 128 and 112 through an inverter 166. The output terminal $\overline{Q}$ of the FF 164 is connected also to a down counter $42_1$ and the respective clock input terminals of D-FF's $44_{1a}$ and $44_{1b}$ through an inverter 168.

The components 100 to 168 constitute a high-speed divider 40.

The counter $42_1$ counts down a first data preset for each dividing cycle. The countent of the counter $42_1$ is transmitted to a detector $42_2$ by means of a timing signal $e12_1$. When the current number in the counter $42_1$ is reduced to a predetermined value "3", the detector $42_2$ applies a timing signal $e12_2$ to the D-input terminal of the FF $44_{1a}$. A signal $e16_1$ taken out from an output terminal $\overline{Q}$ of the FF $44_{1a}$ is connected to the D-input terminal of the FF $44_{1b}$. A signal $e16_2$ taken out from an output terminal $\overline{Q}$ of the FF $44_{1b}$ corresponds to the output signal e2. The signal $e12_2$ is delayed by one pulse at a time by the FF's $44_{1a}$ and $44_{1b}$ with timing possessed by a signal e10 taken out from the output terminal of the inverter 168. The timing signal $e16_2$ is also used as a load signal for presetting the first data for the counter $42_1$.

The output terminal $\overline{Q}$ of the FF $44_{1a}$ is connected to respective second inverted input terminals of AND gates 170, 174, 178, 180 and 184 which correspond to the AND gate $44_{2a}$ of FIG. 5. The output terminal $\overline{Q}$ of the FF $44_{1b}$ is connected to respective second inverted input terminals of AND gates 172, 176, 182 and 186 which correspond to the AND gate $44_{2b}$ of FIG. 5. The output terminals of the AND gates 170 and 172 are connected to first and second input terminals of an OR gate 188 respectively. The output terminals of the AND gates 174 and 176 are connected to first and second input terminals of an OR gate 190. The output terminals of the AND gates 178, 180 and 182 are connected to first, second and third input terminals of an OR gate 192 respectively. The output terminal of the AND gates 184 and 186 are connected to first and second input terminals of an OR gate 194.

The output terminals of the OR gates 188 and 190 are connected to third input terminals of the NAND gates 116 and 136 respectively. The output terminals of the OR gates 192 and 194 are connected to third input terminals of the AND gates 156 and 158 respectively. The OR gates 188 to 194 correspond to the OR gate $44_{2c}$ of FIG. 5. Terminals 228 to 234 form an input terminal to which the 4-bit second data is supplied. These terminals 228, 230, 232 and 234 are connected to first inverted input terminals of the AND gates 170, 174, 178 and 184 via inverters 196, 204, 212 and 220, respectively.

A first column 236 of a data matrix 243 is connected to a first inverted input terminal of the AND gate 172. A second column 238 of the matrix 243 is connected to a first inverted input terminal of the AND gate 176. A third column 240 of the matrix 243 is connected to a first inverted input terminal of the AND gate 182. A fourth column 242 of the matrix 243 is connected to a first inverted input terminal of the AND gate 186. These columns 236 to 242 form an input terminal to which the third data is supplied.

FIG. 7 is a circuit diagram of the first pulse pickup circuit 119 as shown in FIG. 6. In the circuit 119 of FIG. 7, the inverters 106 and 110 are omitted. However, the circuits 119 of FIGS. 6 and 7 are substantially the same. There will now be described the operation of the circuit 119 with reference to the timing chart of FIG. 8. This timing chart shows a case where a signal e108 applied to a third input terminal of the NAND gate 116 is at a level "1". Before a time t1, a signal e102 applied to the D-input terminal of the D-FF 112 is at a level "0". At this time, a signal e104 produced at the output terminal Q of the FF 112 is at the level "0". Thereupon, a signal e110 applied to the first input terminal of the NAND gate 118 is at the level "1", with the NAND gate 116 closed. Then, the NAND gate 118 is equivalent to a mere inverter. Accordingly, before the time t1, an opposite-phase signal to a signal e112 applied to the second input terminal of the NAND gate 118 appears as a signal e114 at the output terminal of the NAND gate 118. Namely, the signal e114 is just the same as an input signal e100 of the inverter 108.

Let us suppose that the signal e102 turns to the level "1" on the time t1. Then, the signal e104 gets at the level "1", accompanying the first rise of the signal e100 at a time t3 after the time t1. At this point of time, a signal e106 applied to the second input terminal of the NAND gate 116 maintains the level "1". Therefore, the signal e110 goes down to the level "0" on the time t3. Then, the NAND gate 118 is closed, and the signal e114 gets at the level "1". When the signal e104 attains the level "1", the D-input terminal of the D-FF 114 also turns to the level "1". Then, the signal e106 produced at the output terminal $\overline{Q}$ of the FF 114 is reduced to the level "0", accompanying the first rise of the signal e100 at a time t5 after the time t3. When the signal e106 is reduced to the level "0", the signal e110 gets at the level "1". At this time, the signal e114 maintains the level "1", since the signal e112 is at the level "0". Immediately when the level of the signal e100 returns to "0" at a time t7, the signal e112 turns to the level "1". At this time, the signal e114 returns to the level "0", since the signal e110 is at the level "1".

Now let us suppose that the signal e102 returns to the level "0" on a time t9. Then, the signal e104 returns to the level "0", accompanying the first rise of the signal e100 at a time t11 after the time t9. Consequently, the signal e106 returns to the level "1", accompanying the first rise of the signal e100 at a time t13 after the time t11. Thus, the same state before the time t1 is restored on the time t13. A pulse pick-up operation is performed during a time since the signal e102 gets at the level "1" at the time t1 until the signal e106 returns to the same level at the time t13. That is, during a period of time t1 to t13, the input signal e100 and the output signal e114 are produced up to 4 and 3 pulses respectively (here the fractional pulses are discarded). Thus, one pulse is picked up when the level "1" is applied to the D-input terminal of the D-FF 112 on condition that the third input terminal of the NAND gate 116 is kept at the level "1". On the other hand, where the third input terminal of the NAND gate 116 is kept at the level "0", the pulse pick-up may not be done without regard to the level of the D-input terminal of the D-FF 112.

Figure 9:
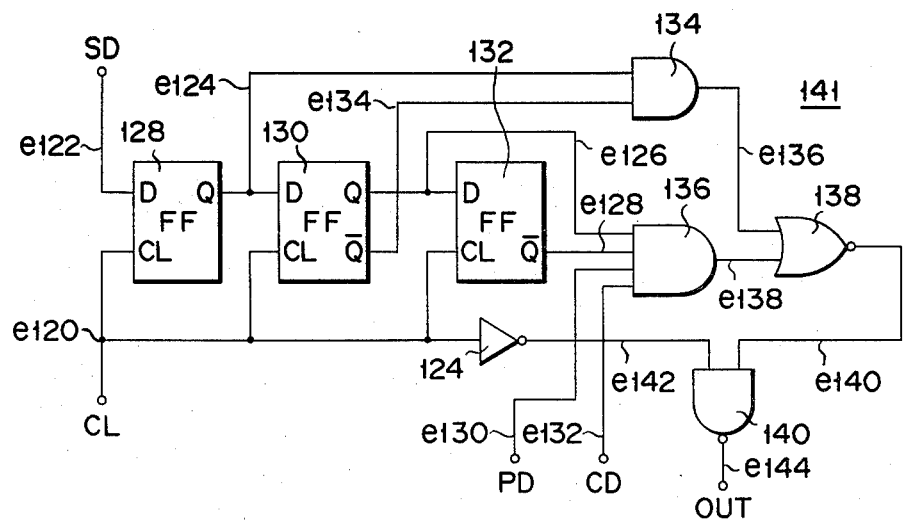
FIG. 9 is a circuit diagram of a second pulse pick-up circuit 141 as shown in FIG. 6.
Figure 11:
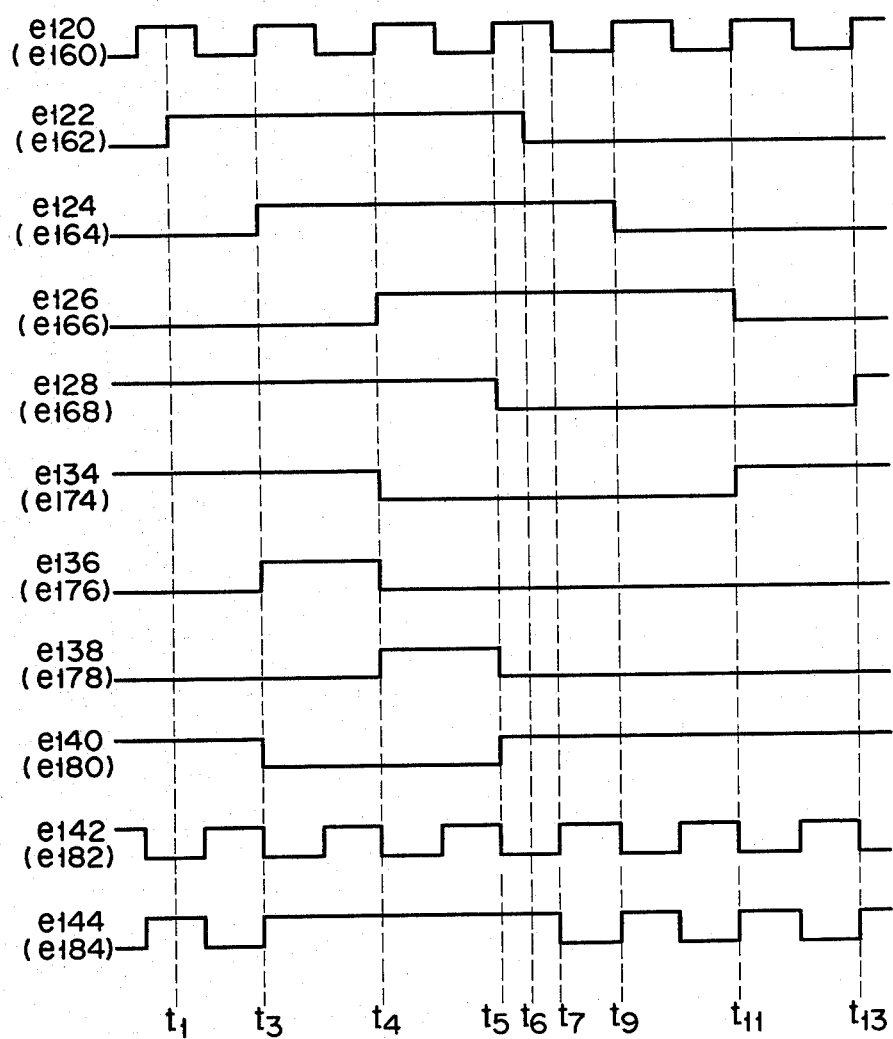
FIG. 11 is a timing chart for illustrating the operations of the circuits of FIGS. 9 and 10.

FIG. 9 is a circuit diagram of the second pulse pick-up circuit 141 as shown in FIG. 6. In the circuit 141 of FIG. 9, the inverters 122 and 126 are omitted. Since the circuit 141 is also intended for any other applications than such divider circuit as shown in FIG. 6, the AND gate 136 is provided with a fourth input terminal. However, the circuits 141 of FIGS. 6 and 9 are substantially the same. There will now be described the operation of the circuit 141 with reference to the timing chart of FIG. 11. This timing chart shows a case where signals e130 and e132 applied respectively to third and fourth input terminals of the AND gate 136 are both at the level "1".

Before a time t1, a signal e122 applied to the D-input terminal of the D-FF 128 is at the level "0". At this time, a signal e124 produced at the output terminal Q of the FF 128 is at the level "0". Thereupon, a signal e136 applied to the first input terminal of the NOR gate 138 is at the level "0", with the AND gate 134 closed. At this time, a signal e126 produced at the output terminal Q of the FF 130 is at the level "0". Then, a signal e138 applied to the second input terminal of the NOR gate 138 is also at the level "0", with the AND gate 136 closed. Accordingly, a signal e140 applied from the NOR gate 138 to the first input terminal of the NAND gate 140 is at the level "1". Then, the NAND gate 140 is equivalent to a mere inverter. Accordingly, before the time t1, an output signal e144 of the NAND gate 140 is just the same as an input signal e120 of the inverter 124.

Let us suppose that the level of the signal e122 turns to "1" on the time t1. Then, the signal e124 gets at the level "1", accompanying a rise of the signal e120 at a time t3. At this point of time, a signal e134 applied to the second input terminal of the NAND gate 134 maintains the level "1". Therefore, the signal e136 gets at the level "1" and the signal e140 goes down to the level "0" on the time t3. Then, the NAND gate 140 is closed, and the signal e144 gets at the level "1". Meanwhile, when the signal e124 attains the level "1", the D-input terminal of the D-FF 130 also turns to the level "1". Then, the signal e126 gets at the level "1" and the signal e134 returns to the level "0", accompanying a rise of the signal e120 at a time t4. Hereupon, the signal e136 derived from the output of the AND gate 134 returns to the level "0". At this point of time, signals e126 and e128 applied to the first and second input terminals of the AND gate 136 are both at the level "1". Then, the signal e138 applied from the AND gate 136 to the NOR gate 138 gets at the level "1" on the time t4. Accordingly, the signal e140 derived from the output of the NOR gate 138 is kept at the level "0", so that the output signal e144 of the NAND gate 140 maintains the level "1".

At a time t5, the signal e126 applied to the D-input terminal of the D-FF 132 maintains the level "1". Accordingly, the signal e128 derived from the output terminal Q of the FF 132 is reduced to the level "0", accompanying a rise of the signal e120 at the time t5. Then, the signal e138 applied from the AND gate 136 to the NOR gate 138 returns to the level "0". As a result, the signal e140 applied from the NOR gate 138 to the NAND gate 140 returns to the level "1". At this point of time, the signal e142 supplied from the inverter 124 to the NAND gate 140 is at the level "0". Accordingly, the output signal e144 of the NAND gate 140 maintains the level "1". On and after the time t5, the signal e140 applied from the NOR gate 138 to the NAND gate 140 is at the level "1". Then, the NAND gate 140 is equivalent to an inverter. Therefore, on and after a time t7 (practically, on and after the time t5), the signal e144 is the same as the signal e120.

Let us suppose that the signal e122 returns to the level "0" on a time t6. Then, the signal e124 returns to the level "0", accompanying a rise of the signal e120 at a time t9. When the signal e124 gets at the level "0", the signals e126 and e134 return to the levels "0" and "1" respectively, accompanying a rise of the signal e120 at a time t11. Then, a rise of the signal e120 at a time t13 causes the signal e128 to return to the level "1". Thus, the same state before the time t1 is restored on the time t13. A pulse pick-up operation is performed during a time since the signal e122 gets at the level "1" at the time t1 until the signal e128 returns to the same level "1" at the time t13. That is, during a period of time t1 to t13, the input signal e120 and the output signal e144 are produced up to 5 and 3 pulses respectively. Thus, two pulses are picked up when the level "1" is applied to the D-input terminal of the D-FF 128 on condition that the third and fourth input terminals of the AND gate 136 are kept at the level "1".

On the other hand, when the signal e130 and/or the signal e132 supplied to the AND gate 136 are at the level "0", the AND gate 136 is closed. In this case, the FF 132 and AND gate 136 may be considered not to exist in the circuit 141 of FIG. 9, practically. Further, the AND gate 134 plus the NOR gate 138 is equivalent to the NAND gate 116 of FIG. 7. That is, the second pulse pick-up circuit 141 with the signals e130 and/or e132 at the level "0" can be regarded as equivalent to the first pulse pick-up circuit 119 of FIG. 7 with the signal e108 at the level "1". Accordingly, the second pulse pick-up circuit 141 can pick up one or two pulses.

Figure 10:
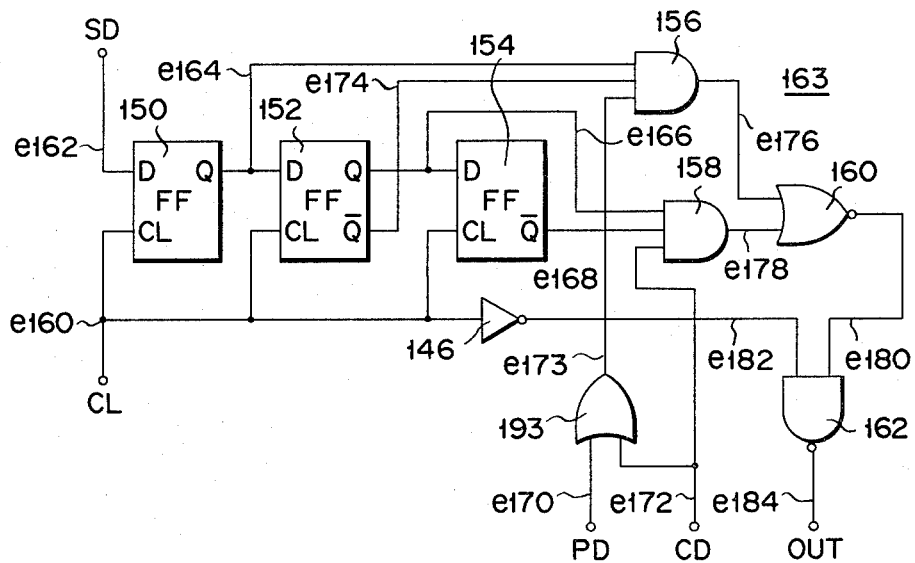
FIG. 10 is a circuit diagram of a third pulse pick-up circuit 163 as shown in FIG. 6.

FIG. 10 is a circuit diagram of the third pulse pick-up circuit 163 as shown in FIG. 6. In the circuit 163 of FIG. 10, the inverters 144 and 148 are omitted. Since the circuit 163 is also intended for any other applications than such divider circuit as shown in FIG. 6, the circuit arrangement on the third input terminal side of the AND gate 156 is somewhat modified. Namely, signals e170 and e172 for designating the number of pulses picked up are supplied to first and second input terminals of an OR gate 193 respectively. An output signal e173 of the OR gate 193 is applied to the third input terminal of the AND gate 156. The signal e172 is applied to a third input terminal of the AND gate 158. The OR gate 193 corresponds to the OR gate 192 plus the OR gate 194 of FIG. 6.

In the circuit 163, when the signals e170 and e172 are both at the level "0", the AND gates 156 and 158 are closed. Thereupon, a signal e180 supplied from the NOR gate 160 to the NAND gate 162 is at the level "1". At this time, the NAND gate 162 functions as a mere inverter, and no pulse is picked up. When the signals e170 and e172 are at the levels "1" and "0" respectively, the AND gate 156 is opened and the AND gate 158 is closed. This is just the same as the state in which the signals e130 and/or e132 are at the level "0" in the circuit 141 of FIG. 9. That is, when the signals e170 and e172 are at the levels "1" and "0" respectively, the circuit 163 is allowed to pick up one pulse. When the signal e172 is at the level "1", the AND gates 156 and 158 open without regard to the level of the signal e170. This is the same as the case where the signals e130 and e132 are both at the level "1" in the circuit 141. That is, when the signal e172 is at the level "1", the circuit 163 is allowed to pick up two pulses.

The set numbers of pulses picked up by the pulse pick-up circuits of FIGS. 7, 9 and 10 are as shown in Table 1A.

TABLE 1A

| First pulse pick-up circuit 119 | Second pulse pick-up circuit 141 | | Third pulse pick-up circuit 163 | | |
|---|---|---|---|---|---|
| e108 Number of pulse | e130 | e132 Number of pulse(s) | e170 | e172 Number of pulse(s) |
| 0 | 0 | 0 | 0 | 1 | 0 | 0 | 0 |
| 1 | 1 | 0 | 1 | 1 | 0 | 1 | 2 |
| | | 1 | 0 | 1 | 1 | 0 | 1 |
| | | 1 | 1 | 2 | 1 | 1 | 2 |

Referring to FIG. 6, let us suppose that the output signals of the OR gates 188, 190, 192 and 194 are e188, e190, e192 and e194 respectively. In this case, Table 1A may be replaced by Table 1B.

TABLE 1B

| First pulse pick-up circuit 119 | Second pulse pick-up circuit 141 | | Third pulse pick-up circuit 163 | | |
|---|---|---|---|---|---|
| e188 Number of pulse | e190 | Number of pulse(s) | e192 | e194 | Number of pulse(s) |
| 0 | 0 | 0 | 1 | 0 | 0 | 0 |
| 1 | 1 | 1 | 2 | 0 | 1 | 2 |
| | | | | 1 | 0 | 1 |
| | | | | 1 | 1 | 2 |

Referring now to Table 1B, there will be described the dividing operation of the high-speed divider 40 as shown in FIG. 6.

(i) Where (e194, e192, e190, e188)=(0, 0, 0, 0): Let it be supposed that the input signal e1 is provided up to 10 pulses. Since the circuit 119 makes no pulse pick-up, 10 pulses are applied to the input of the ½ divider 120. Then, 5 pulses are supplied to the circuit 141. The circuit 141 is ready for 1-pulse pick-up, so that 4 pulses are applied to the input of the ½ divider 142. Then, 2 pulses are supplied to the circuit 163. Since the circuit 163 makes no pulse pick-up, 2 pulses are applied to the input of the ½ divider 164. Then, the output signal e10 of the divider 40 includes 1 pulse. Thus, the divider 40 provides 1-pulse output signal e10 for 10 pulses of the input signal e1. Namely, the dividing ratio $N_{H1}$ of the divider 40 becomes "10".

(ii) Where (e194, e192, e190, e188)=(1, 0, 0, 1): Let it be supposed that the input signal e1 is provided up to 19 pulses. Since the circuit 119 is ready for 1-pulse pick-up, 19 pulses are applied to the input of the ½ divider 120. Then, 9 pulses are supplied to the circuit 141. The circuit 141 is ready for 1-pulse pick-up, so that 8 pulses are applied to the input of the ½ divider 142. Then, 4 pulses are supplied to the circuit 163. Since the circuit 163 is ready for 2-pulse pick-up, 2 pulses are applied to the input of the ½ divider 164. Then, the output signal e10 of the divider 40 includes 1 pulse. Namely, the dividing ratio $N_{H2}$ of the divider 40 becomes "19".

(iii) Where (e194, e192, e190, e188)=(0, 1, 1, 1): Let it be supposed that the input signal e1 is provided up to 17 pulses. Since the circuit 119 is ready for 1-pulse pick-up, 16 pulses are applied to the input of the ½ divider 120. Then, 8 pulses are supplied to the circuit 141. The circuit 141 is ready for 2-pulse pick-up, so that 6 pulses are applied to the input of the ½ divider 142. Then, 3 pulses are supplied to the circuit 163. Since the circuit 163 is ready for 1-pulse pick-up, 2 pulses are applied to the input of the ½ divider 164. Then, the output signal e10 of the divider 40 includes 1 pulse. Namely, the dividing ratio $N_{H3}$ of the divider 40 becomes "17". Thus, in the divider 40, the dividing ratio $N_H$ may be changed by "1" at a time within a range from "10" to "21" [corresponding to the range from (0000) to (1111) of the code (e194, e192, e190, e188)]. FIGS. 12A to 12C show the correspondence of the dividing ratio designation data 46 to the dividing operations of the high- and low-speed dividers 40 and 42. FIG. 12A is a timing chart prepared by simplifying the chart of FIG. 4. When the data 46 is given as "797", the dividing ratio $N=N_H N_L=186$ is obtained. The two higher-order digits "7" and "9" of the data 46 correspond to the received frequency of 79 MHz, while the lowest-order digit "7" corresponds to the offset data or second dividing ratio N2. The dividing ratio $N_L$ of the divider 42 is determined by the highest-order digit (1st data) of the data 46. The dividing ratio $N_{H2}$ of the divider 40 is determined by the middle-order digit (2nd data) of the data 46, while the dividing ratio $N_{H3}$ of the divider 40 is determined by the lowest-order digit (3rd data) of the data 46. The 3rd data "7" may also be used for setting the offset data N2=107 for the intermediate frequency of 10.7 MHz.

The relation between the respective dividing ratios $N_H$ and $N_L$ of the high- and low-speed dividers 40 and 42 and the composite dividing ratio N of the dividers 40 and 42 is as follows:

$$N=(N_L-2)N_{H1}+N_{H2}+N_{H3}. \quad (1)$$

It may easily be understood from FIGS. 12A to 12C that eq. (1) holds. Applying eq. (1) to the case of FIG. 12B, for example, we obtain $$N=(18-2)\times 10+14+17=191.$$

Further generalizing eq. (1), we obtain $$N = \{N_L - (n-1)\}N_{H1} + \sum_{i=2}^{n} N_{Hi}. \quad (2)$$

eq. (2) represents the basic character of the programmable divider according to this invention as shown in FIG. 3. Here n is a numerical value that the dividing ratio $N_H$ can take in one dividing cycle. If n=1, for example, $N=N_H N_L$, which corresponds to a case where prior art dividers are two-stage series-connected.

The second data for the divider 40, for example "9", is programmed by supplying 1, 0, 0 and 1 to the terminals 234, 232, 230 and 228 respectively. A 4-bit code 1001 corresponds to "9" in BCD code. Likewise, the third data, for example "3", is programmed by supplying 0, 1, 1 and 1 to the columns 242, 240 238 and 236 of the data matrix 243 respectively. A 4-bit code 0111 corresponds to "7" in BCD code.

The data matrix 243 is so constructed as shown in FIG. 13, for example. In the matrix 243 of FIG. 6, intersecting points indicated by double circles are replaced by N-channel MOS FET's, while points indicated by single circles are replaced by P-channel MOS FET's. These P-channel FET's are utilized as load resistances. That is, the first column 236 is connected with the respective drains of N-channel FET's T12, T13 and T15 and a P-channel FET T1. The second column 238 is connected with the respective drains of N-channel FET's T23, T24, T25 aND T26 and a P-channel FET T2. The third column 240 is connected with the respective drains of N-channel FET's T32, T33 and T34 and a P-channel FET T3. The fourth column 242 is connected with the respective drains of N- and P-channel FET's T42 and T4. The respective sources and substrates of the P-channel FET's T1 to T4 are connected to a positive power source $+V_{CC}$. The gate of the FET's T1 to T4 are grounded. The respective sources and substrates of the N-channel FET's T12 to T42 are grounded.

First to sixth rows of the matrix 243 are connected to the positive power source $+V_{CC}$ through switches S1 to S6 and are grounded through resistors R1 to R6 respectively. The respective gates of the FET's T12, T32 and T42 are connected to the second row. The respective gates of the FET's T13, T23 and T33 are connected to the third row. The respective gates of the FET's T24 and T34 are connected to the fourth row. The respective gates of the FET's T15 and T25 are connected to the fifth row. The gate of the FET T26 is connected to the sixth row. The matrix 243 is so constructed as to provide BCD codes in negative logic. For example, when the switch S1 alone is on, the respective levels of the fourth, third, second and first columns are 1, 1, 1 and 1, which correspond to 0, 0, 0 and 0 in positive logic. Namely, when the switch S1 alone is turned on, the other switches are turned off, and the third data becomes (1, 1, 1, 1) which corresponds to "0" in BCD code. Similarly, when the switch S3 alone is turned on, the third data (4th, 3rd, 2nd and 1st columns) becomes (1, 0, 0, 0) which corresponds to "7" in BCD code.

FIG. 14 shows a specific arrangement of the low-speed divider or down counter $42_1$. A clock input signal e200 to be divided is applied to the respective clock input terminals of a presettable down counter 300 and a D-FF 306. Preset terminals PD1, PD2, PD3 and PD4 of the counter 300 are supplied with signals for presetting e202, e204, e206 and e208 respectively. Output terminals Q1, Q3 and Q4 of the counter 300 are connected to first, third and fourth inverted input terminals of an AND gate 304 respectively. An output terminal Q2 of the counter 300 is connected to the input terminal of an inverter 302. A signal e213 delivered from the output terminal of the inverter 302 is applied to a second inverted input terminal of the AND gate 304. The output terminals Q1, Q2, Q3 and Q4 deliver signals e210, e212, e214 and e216, respectively, which constitute a 4-bit timing signal $e12_1$. An output signal e218 of the AND gate 304 is applied to the D-input terminal of the FF 306. A divided output signal e220 is delivered from an output terminal Q of the FF 306. The signal e220 is also used for loading the counter 300 with the preset data (e208, e206, e204, e202). The signals e200 and e220 correspond to the signals e10 and $e12_2$ as shown in FIG. 5 or 6, respectively.

Referring now to the timing chart of FIG. 15, there will be described the operation of the divider $42_1$ of FIG. 14. Here let it be supposed that the preset data (e208, e206, e204, e202) is "8" in BCD code or (1, 0, 0, 0). Before a time t10, with the signal e220 at the level "1", the counter 300 is loaded with the preset data "8". At the terminal Q1 of the counter 300 develops the signal e210 obtained by dividing the signal e200 into ½. Likewise, at the terminals Q2, Q3 and Q4 develop the signals e212, e214 and e216 obtained by dividing the signals produced at the terminals Q1, Q2 and Q3, respectively, into ½. At the time t10, the signal e218 is at the level "0", so that the signal e220 is reduced to the level "0" accompanying the first rise of the signal e220 at the time t10. The preset signal "8" is being loaded at the time t10, so that the signals e210 to e216 are produced accompanying the second rise of the signal e200, that is, on a time t12.

By the signal e200, the numerical content of the counter 300 is reduced from "8" by "1" at a time. When the number in the counter 300 has been reduced to "2" with the seventh rise of the signal e200 or on a time t14, the timing signal $e12_1 = (e216, e214, e212, e210)$ becomes (0, 0, 1, 0). At this time, the signal e212 is changed from the level "1" to the level "0" by the inverter 302. Then, the first to fourth inverted input terminals of the AND gate 304 are all at the level "0". Accordingly, when a time t14 is reached, the D-input terminal of the FF 306 turns to the level "1". When the D-input terminal gets at the level "1", the signal e220 from the output Q of the FF 306 is turned to the level "1" by eighth rise of th signal e200 or on a time t16. When the signal e220 gets at the level "1", the counter 300 is again loaded with the preset data "8". Thereupon, the signal e216 gets at the level "1", so that the signal e218 returns to the level "0". Then, the signal e220 returns to the level "0", accompanying the ninth rise of the signal e200 or on a time t18.

Between the times t10 and t18, the signal e200 is produced up to 8 pulses, while 1 pulse is produced for the signal e220. That is, the divider $42_1$ is a ⅛ divider corresponding to the preset data "8". The inverter 302 and the AND gate 304 constitute the detector circuit $42_2$ for detecting that the content of the counter 300 is "2". A value Nx=2 detected by the detector $42_2$ is set for compensating a 1-pulse delay of the D-FF 306 and a 1-pulse timing lag in presetting the preset data (e208, e206, e204, e202). If the detected value Nx=0 where the preset data is "8", then the counter 300 is a decimal counter.

In FIG. 14, the counter 300 is of 4-bit configuration. Therefore, the dividing ratio $N_L$ of the divider $42_1$ may freely be set between 1 and 16. The dividing ratio $N_L$ of "17" or higher may be obtained by rearranging the counter 300 into 5-bit configuration. In this case, the dividing ratio may be set within a range from 1 to 32.

FIG. 16 shows a modification of the arrangement as shown in FIG. 3. An input signal e1 is applied to the input of a low-speed divider 42 through a high-speed divider 40. A timing signal e12 delivered from the low-speed divider 42 is applied to the input of a delay circuit $44_1$. A delay signal e16 from the delay circuit $44_1$ is applied to the input of a pulse pick-up circuit 44₃. The pulse pick-up circuit 44₃ is coupled to the high-speed divider 40 by means of an instruction signal e14 for pulse interval extension. The pulse pick-up circuit 44₃ and the low-speed divider 42 are supplied with first and second data of a dividing ratio designation data 46 respectively. The arrangement of FIG. 16 differs from the one shown in FIG. 3 mainly in the following points.

(i) In FIG. 16, the dividing ratio designation data 46 is formed of two parts. The first data of the data 46 is used for designating pulse pick-up for the high-speed divider 40, while the second data is used for designating a dividing ratio $N_L$ for the low-speed divider 42.

(ii) In FIG. 16, a dividing ratio $N_H$ of the high-speed divider 40 is fixed. By way of compensation, however, the dividing ratio $N_H$ is apparently changed by a pulse pick-up operation.

FIG. 17 is a circuit diagram for further detailed illustration of the arrangement as shown in FIG. 16. An output signal e1 is applied to a clock input terminal CL11 of a first pulse pick-up circuit (first PU) 400. An output signal e400 of the first PU 400 is applied to a clock input terminal CL 14 of a first ½ divider or first FF 406. An output signal e406 of the first FF 406 is applied to a clock input terminal CL 12 of a second pulse pick-up circuit (second PU) 402. An output signal e402 of the second PU 402 is applied to a clock input terminal CL15 of a second ½ divider or second FF 408. An output signal e408 of the second FF 408 is applied to a clock input terminal CL13 of a third pulse pick-up circuit (third PU) 404. An output signal e404 of the third PU 404 is applied to a clock input terminal CL16 of a third ½ divider or third FF 410. An output signal e10 of the third FF 410 is applied to respective clock input terminals CL21 and CL17 of a fourth FF 412 and a D-FF 422. The first, second and third PU's 400, 402 and 404 form the pulse pick-up circuit 44₃. For these pulse pick-up circuits, there are used such 1-pulse pick-up circuit as shown in FIG. 7, for example. Also, the first, second and third FF's 406, 408 and 410 constitute the high-speed divider 40.

A signal e412 derived from an output terminal Q of the fourth FF 412 is applied to a clock input terminal CL 22 of a fifth FF 414. A signal e414 from an output terminal Q of the fifth FF 414 is applied to a clock input terminal CL23 of a sixth FF 416. A signal e416 from an output terminal Q of the sixth FF 416 is connected to a clock input terminal Cl 24 of a seventh FF 418. Signals e413, e415 and e419 derived from respective output terminal $\bar{Q}$ of the fourth, fifth and seventh FF's 412, 414 and 418 are applied to first, second and fourth input terminals of an AND gate 420. The signal e416 from the output temimal Q of the sixth FF 416 is applied to a third input terminal of the AND gate 420. An output signal or timing signal e12 from the AND gate 420 is supplied to the D-input terminal of the D-FF 422. The fourth, fifth, sixth and seventh FF's 412, 414, 416 and 418 and the AND gate 420 constitute the low-speed divider 42.

An output signal e2 may be obtained from an output terminal Q of the D-FF 422. The signal e2 is supplied to respective terminals SD11, SD12 and SD13 of the first, second and third PU's 400, 402 and 404. The first to third PU's make pulse pick-up in accordance with the timing of the signal e2 applied to the terminals SD11 to SD13. The signal e2 is also used as a load signal for the fourth to seventh FF's 412 to 418.

A terminal b of a second bit of a dividing ratio designation data 46 as counted from the MSD (most significant digit) thereof is connected to a PD13 of the third PU 404. A terminal c of a third bit of the data 46 is connected to a terminal PD12 of the second PU 402. A terminal d of a fourth bit of the data 46 is connected to a terminal PD11 of the first PU 400. A terminal e of a fifth bit of the data 46 is connected to a terminal PD24 of the seventh FF 418. A terminal f of a sixth bit of the data 46 is connected to a terminal PD23 of the sixth FF 416. A terminal g of a seventh bit of the data 46 is connected to a terminal PD22 of the fifth FF 414. A terminal h of an eighth bit of the data 46 is connected to a terminal PD21 of the fourth FF 412. The first to fourth bits of the data 46 form a first data to designate a number of pulses to be picked up by the pulse pick-up circuit 44₃. Likewise, the fifth to eighth bits form a second data to designate a dividing ratio $N_L$ of the low-speed divider 42.

Let us suppose a case where a divider of the arrengement as shown in FIG. 17 is made to perform a 1/79 dividing operation. Here a dividing data 46 is to correspond to 1/79 division. Where N=79, the first data may be represented by a 4-bit code (0111) or "7" in BCD code, while the second data may be represented by a 4-bit code (1001) or "9" in BCD code. The lower three bits, "1, 1 and 1" of the first data are supplied to the first, second and third PU's 400, 402 and 404 respectively. The first to third PU's 400 to 404 can perform a 1-pulse pick-up operation when a bit "1" of the first data is given thereto. As for the pulse pick-up operation, it has already been described herein with reference to FIG. 7. The 4-bit code (1001) of the second data is used for setting the dividing ratio $N_L$ at "9".

FIG. 18 is a timing chart for illustrating the operation of the programmable divider as shown in FIG. 17. Between times t1 and t5, the input signal e1 is produced up to 64 pulses. In the meantime, the output of the D-FF 422 or the output signal e2 is at the level "0". Accordingly, none of the first to third PU's 400 to 404 makes pulse pick-up. In consequence, the signals e406, e408 and e10 become equivalent to ones obtained by dividing, respectively, the signals e1, e406 and e408 into ½. That is, while the signal e1 is produced up to 64 pulses, the signal e10 develops up to 8 pulses.

At a time t3 when the signal has been produced up to 7 pulses, the level of the respective outputs Q of the seventh, sixth, fifth and fourth FF's 418, 416, 414 and 412 is found to be 9−7=2 or (1001)=(0111)=(0010). Then, the levels of the signals e419, e416, e415 and e413 become "1, 1, 1 and 1". Namely, the AND gate 420 is opened at a point of time when the signal e10 is produced up to 10. When the AND gate 420 is opened, the timing signal e12 applied to the D-input terminal of the D-FF 422 gets at the level "1". Then, accompanying the production of the 8th pulse of the signal e10, the signal e12 returns to the level "0", and the signal e2 turns to "1".

When the signal e2 gets at the level "1", the first to third PU's 400 to 404 get ready for their respective 1-pulse pick-up operations. These pick-up operations are performed at points of time indicated by marks * in FIG. 18. The signal e404 is obtained by picking up 1 pulse from the signal e408 after a time t5. Therefore, the 18th pulse of the signal e404 corresponds to the 19th pulse of the signal e408. The signal e408 is obtained by dividing the signal e402 into ½, so that the 19th pulse of the signal e408 corresponds to the 38th pulse of the signal e402. The signal e402 is obtained by picking up 1 pulse from the signal e406, so that the 38th pulse of the signal e402 corresponds to the 39th pulse of the signal e406. The signal e406 is obtained by dividing the signal e400 into ½, so that the 39th pulse of the signal e406 corresponds to the 78th pulse of the signal e400. The signal e400 is obtained by picking up 1 pulse from the signal e1, so that the 78th pulse of the signal e400 corresponds to the 79th pulse of the signal e1.

It will be understood from the above description that the 79th pulse of the signal e1 corresponds to the 18th pulse of the signal e404. When the 18th pulse of the signal e404 is produced at a time t7, the 9th pulse of the signal e10 develops. The D-input terminal of the D-FF 422 is at the level "0" on and after the time t5, so that the signal e2 returns to the level "0", accompanying the production of the 9th pulse of the signal e10. Thus, one dividing cycle is completed. That is, between the times t1 and t7, the input signal e1 is produced up to 79 pulses while 1 pulse is produced for the output signal e2. Thus, the divider as shown in FIG. 17 performs 1/79 dividing operation when the dividing ratio designation data "79" is programmed therein. In this divider, the dividing ratio $N_L$ of the low-speed divider 42 is fixed at "9", though the dividing ratio $N_H$ of the high-speed divider 40 is apparently changed by the pulse pick-up operations. Namely, the dividing ratio $N_{H1}=8$ between the times t1 and t5, whereas the dividing ratio $N_{H2}=15$ between the times t5 and t7. The dividing ratio N of the divider of FIG. 17 may be obtained by substituting $n=2$, $N_L=9$, $N_{H1}=8$ and $N_{H2}=15$ into the corresponding terms of eq. (2) as follows:

$$N=\{9-(2-1)\}\times 8+15=79.$$

FIG. 19 is a circuit diagram showing the pulse pick-up circuit 44₃ and high-speed divider 40 taken out from the arrangement of FIG. 17. The first, second and third PU's 400, 402 and 404 of FIG. 17 may be embodied in the circuit as shown in FIG. 7, 9 or 10. To simplify the arrangements of the circuits of FIG. 19, D-FF's for signal delay are used in common between a plurality of pulse pick-up circuits (between first and second PU's and between second and third PU's).

A signal e1 is applied to a second input terminal of a NAND gate 506 through an inverter 500. The signal e1 is applied also to a clock input terminal CL11 of a D-FF 502. An output terminal $\overline{Q}$ of the FF 502 is connected to a second input terminal of a NAND gate 504. The output terminal of the NAND gate 504 is connected to a first input terminal of the NAND gate 506. The output terminal of the NAND gate 506 is connected to a clock input terminal CL14 of a first FF 406. An output terminal Q of the FF 406 is connected to a second input terminal of a NAND gate 516 through an inverter 510, and also to a clock input terminal CL 12 of a D-FF 512. An output Q of the FF 512 is connected to the D-input terminal of the FF 502 and a first input terminal of the NAND gate 504. The FF's 502 and 512, the NAND gates 504 and 506, and the inverter 500 form the first pulse pick-up circuit 400.

An output terminal $\overline{Q}$ of the FF 512 is connected to a second input terminal of a NAND gate 514. The output terminal of the NAND gate 514 is connected to a first input terminal of the NAND gate 516, the output terminal of which is connected to a clock input terminal CL 15 of a second FF 408. An output terminal Q of the FF 408 is connected to a second input terminal of a NAND gate 526 through an inverter 520. The output terminal Q of the FF 408 is connected also to respective clock input terminals CL13a and CL13b of D-FF's 521 and 522. An output terminal Q of the FF 521 is connected to the respective D-input terminals of the FF's 512 and 522 and respective first input terminals of the NAND gate 514 and a NAND gate 524. The FF's 512 and 521, the NAND gates 514 and 516, and the inverter 510 form the second pulse pick-up circuit 402.

An output terminal $\overline{Q}$ of the FF 522 is connected to a second input terminal of the NAND gate 524. The output terminal of the NAND gate 524 is connected to a first input terminal of the NAND gate 526, the output terminal of which is connected to a clock input terminal CL 16 of a third FF 410. A signal e10 is delivered from an output Q of the FF 410. An output signal e2 is applied to the D-input terminal of the FF 521. The FF's 521 and 522, the NAND gates 524 and 526, and the inverter 520 form the third pulse pick-up circuit 404. Respective third input terminals of the NAND gates 504, 514 and 524 are connected to input terminals PD11, PD12 and PD13 for pulse pick-up data, respectively.

As for the pulse pick-up operations of the circuit as shown in FIG. 19, they have already been described herein with reference to FIG. 7, so they are to be excluded from the description here. In the circuit of FIG. 19, if the pulse pick-up data (PD13, PD12, PD11) is (0, 0, 0), the dividing ratio $N_H$ of the high-speed divider 40 is "8". If the data (PD13, PD12, PD11) is (1, 1, 1), however, the dividing ratio $N_H$ is "15". That is, the dividing ratio $N_H$ may freely be preset between "8" and "15".

FIG. 20 shows a modification of the arrangement as shown in FIG. 16 or 17. The main difference of the arrangement of FIG. 20 from the one shown in FIG. 16 or 17 lies in the existence of a means for providing a pulse pick-up data and a pulse pick-up timing for a pulse pick-up circuit 44₃. That is, in the arrangement of FIG. 20, a second data of a dividing ratio designation data 46 is utilized as a pulse pick-up instruction data for the pulse pick-up circuit 44₃. As for the pulse pick-up timing for the circuit 44₃, it is determined by either an output signal e10 of a high-speed divider 40 or an output signal e16 of a delay circuit 44₁. The second data output of the dividing ratio designation data 46 is supplied to first, second and third PU's 400, 402 and 404 by means of a data bus 440. Also, the signals e10 and e16 are supplied to each of the first to third PU's 400 to 404 by means of a data bus 450.

The pulse pick-up circuit 44₃ as shown in FIG. 20 is composed of three pulse pick-up circuits, i.e. the first to third PU's. The number of these pulse pick-up circuits may, however, be changed as required.

FIG. 21 is a detailed circuit diagram showing the high-speed divider 40 and pulse pick-up circuit 44₃ taken out from the arrangement of FIG. 20. An input signal e1 is applied to a second input terminal of a NAND gate 606 through an inverter 600. The signal e1 is applied also to the clock input terminal of a D-FF 602. An output terminal of the FF 602 is connected to a second input terminal of a NAND gate 604. The output terminal of the NAND gate 604 is connected to a first input terminal of the NAND gate 606. A signal e400 derived from the output terminal of the NAND gate 606 is applied to the clock input terminal of a first FF 406. A signal e406 derived from the output terminal of the first FF 406 is applied to a second input terminal of a NAND circuit 616 through an inverter 610. The signal e406 is applied also to the respective clock input terminals of D-FF's 611 and 612. An output terminal Q of the FF 611 is connected to the D-input terminal of the FF 612 and a first input terminal of an AND gate 614. The output terminal Q of the FF 611 is connected also to the D-input terminal of the FF 602 and a first input terminal of the NAND gate 604.

An output terminal $\overline{Q}$ of the FF 611 is connected to a second input terminal of an AND gate 615. An output terminal $\overline{Q}$ of the FF 612 is connected to a second input terminal of the AND gate 614. The output terminals of the AND gates 615 and 614 are connected to first and second input terminals of a NOR gate 617 respectively. The output terminal of the NOR gate 617 is connected to a first input terminal of the NAND gate 616. A signal e402 derived from the output terminal of the NAND gate 616 is applied to the clock input terminal of a second FF 408. A signal e408 derived from an output terminal Q of the second FF 408 is applied to a second input terminal of a NAND gate 626 via an inverter 620. The signal e408 is applied also to the respective clock input terminals of D-FF's 621, 622 and 623.

An output terminal Q of the FF 621 is connected to the D-input terminal of the FF 622 and a first input terminal of an AND gate 625. The output terminal Q of the FF 621 is connected also to the D-input terminal of the FF 611 and a first input terminal of the AND gate 615. Output terminals Q and $\overline{Q}$ of the FF 622 are connected to a first input terminal of an AND gate 624 and a second input terminal of the AND gate 625 respectively. The output terminal Q of the FF 622 is connected also to the D-input terminal of the FF 623. An output terminal $\overline{Q}$ of the FF 623 is connected to a second input terminal of the AND gate 624. The output terminals of the AND gates 625 and 624 are connected to first and second input terminals of a NOR gate 627 respectively. The output terminal of the NOR gate 627 is connected to a first input terminal of the NAND gate 626. A signal e404 derived from the output terminal of the NAND gate 626 is applied to the clock input terminal of a third FF 410. A signal e10 derived from an output terminal Q of the third FF 410 is applied to the clock input terminal of a D-FF 44$_1$. The signal e10 is supplied also to the D-input terminal of the FF 621 by means of a data line 450$_1$. The D-input terminal of the FF 44$_1$ is supplied with a timing signal e12 from a low-speed divider 42 (not shown). A delay signal e16 derived from an output terminal Q of the FF 44$_1$ is supplied to respective fourth input terminals of the NAND gates 604 and 614 by means of a data line 450$_2$. A third input terminal of the AND gate 625 is connected with the output terminal of an OR gate 628. Second and first input terminals of the OR gate 628 are connected with data terminals A and B respectively. The terminal A is connected also to a third input terminal of the AND gate 624. A third input terminal of the AND gate 614 is connected with a data terminal C, while a third input terminal of the NAND gate 604 is connected with a data terminal D.

The data lines 450$_1$ and 450$_2$ correspond to the data bus 450 of FIG. 20. The FF's 602 and 611, NAND gates 604 and 606, and the inverter 600 correspond to the first pulse pick-up circuit 400. The FF's 611 and 612, AND gates 614 and 615, NOR gate 617, NAND gate 616, and the inverter 610 correspond to the second pulse pick-up circuit 402. The FF's 621, 622 and 623, AND gates 624 and 625, NOR gate 627, NAND gate 626, OR gate 628, and the inverter 620 correspond to the third pulse pick-up circuit 404. Further, the data terminals A, B, C and D are supplied, respectively, with second data (a, b, c, and d) of the dividing ratio designation data 46 from a data bus 440 (not shown).

Let us suppose a case where the data terminals A, B, C and D are supplied, respectively, with 4 bits (0, 0, 1 and 1) of a second data and the low-speed divider 42 (FIG. 20) is supplied with a first data (1000). In this case, the dividing ratio designation data 46 may be represented by "83" in BCD code. Since the terminals A and B are at the level "0", the number of pulse picked up by the third pulse pick-up circuit 404 is zero (cf. right column of Table 1A, in which e172 and e170 correspond to the logic levels of the terminals A and B respectively). Since the terminal C is at the level "1", the number of pulses picked up by the second pulse pick-up circuit 402 is 1 or 2. When the signal e16 is at the level "0", the number of pulse picked up is 1, when at "1", 2 (cf. central column of Table 1A, in which e132 corresponds to the signal e16, and e130 corresponds to the logic level of the terminal C). Since the terminal D is at the level "1", the number of pulse picked up by the first pulse pick-up circuit 400 is 0 or 1. When the signal e16 is at the level "0", the number of pulse picked up is 0; when at "1", 1 (cf. left column of Table 1A, in which e108 corresponds to the signal e16).

A timing chart applicable to a case where the dividing ratio data is set at "83", as described above, is as shown in FIG. 22. When the signal e16 is at the level "0" on and after a time t1, the numbers of pulse picked up by the first and second PU's 400 and 402 are 0 and 1 respectively. The pulse pick-up period of the second PU 402 is determined by the period of a signal e10$_1$ applied to the D-input terminal of the FF 611. The signal e10$_1$ is equivalent to a signal delayed by 1 pulse behind the signal e10. Accordingly, the signal e10$_1$ has the same period with the signal e10. Thus, a signal e402 delivered from the second PU 400 is subjected to pulse pick-up with the same timing as the period of the signal e10.

The 1st pulse of the signal e10 at a time t2 corresponds to the 2nd pulse of a signal e404 through the existence of the third FF 410. Since the number of pulse picked up by the third PU 404 is zero, the 2nd pulse of the signal e404 corresponds to the 2nd pulse of a signal e408. The 2nd pulse of the signal e408 corresponds to the 4th pulse of the signal e402 through the existence of the second FF 408. Since at the time t2 the signal e16 is at the level "0", the number of pulse picked up by the second PU 402 is 1. Accordingly, the 4th pulse of the signal e402 corresponds to the 5th pulse of a signal e406. The 5th pulse of the signal e406 corresponds to the 10th pulse of a signal e400 through the existence of the first FF 406. Since at the time t2 the level of the signal e16 is "0", the number of pulse picked up by the first PU 400 is zero. Accordingly, the 10th pulse of the signal e400 corresponds to the 10th pulse of the input signal e1.

The timing on and after the time t2 may be considered to be the same as aforesaid until a time t5. Namely, at the time t5, the 7th pulse of the signal e10 corresponds to the 28th pulse of the signal e402. The 28th pulse of the signal e402 corresponds to the 35th pulse of the signal e406, since 7 pulses are picked up by the second PU 402 between the times t1 and t7. The 35th pulse of the signal e406 corresponds to the 70th pulse of the input signal e1. Thus, between the times t1 and t5, the signal e1 is produced up to 70 pulses while 7 pulses are produced for the signal e10. That is, it may be considered that a dividing ratio N$_{H1}$ of a high-speed divider 40 is "10" when the signal e16 is at the level "0".

Meanwhile, a timing signal e12 from a low-speed divider 42 gets at the level "1" on the time t3. Then, the signal e12 returns to the level "0" and the signal e16 turns to the level "1" at the time t5, accompanying the production of the 7th pulse of the signal e10. When the signal e16 gets at the level "1", the second PU 402 gets ready for 2-pulse pick-up, and the first PU 400 gets ready for 1-pulse pick-up. In FIG. 22, marks * and ** indicate points of time for 1- and 2-pulse pick-up operations respectively. That is, the 8th pulse of the signal e10 at the time t7 corresponds to the 32th pulse of the signal e402. Since 2 pulses are picked up between the times t5 and t7, the 32th pulse of the signal e402 corresponds to the 41th pulse of the signal e406. The 41th pulse of the signal e406 corresponds to the 82th pulse of the signal e400. Since 1 pulse is picked up between the times t5 and t7, the 82th pulse of the signal e400 corresponds to the 83th pulse of the signal e1. When the 8th pulse of the signal e10 is produced at the time t7, the content of the low-speed divider 42 is reset. Thus, one dividing cycle is completed.

As may be evident from the above-described timing chart of FIG. 22, the dividing ratio of the high-speed divider 40 is changed from $N_{H1}=10$ to $N_{H2}=13$ during a period between the times t5 and t7. The variation "3" of the dividing ratio is obtained from the second data or BCD code "3" applied to the data terminals A, B, C and D. Also, a dividing ratio $N_L$ for the low-speed divider 42 is obtained from the first data or BCD code "8". Substituting $n=2$, $N_L=8$, $N_{H1}=10$ into the corresponding terms of eq. (2), the dividing ratio N of the divider of FIG. 21 may be obtained as follows:

$$N = 8 - (2-1) \times 10 + 13 = 83.$$

Although specific circuit construction have been illustrated and described herein, it is not intended that the invention be limited to the devices and circuits disclosed. One skilled in the art will recognize that the particular elements or sub-circuits may be used without departing from the scope and spirit of the invention.

What is claimed is:

1. A programmable divider having a dividing ratio changeable by a dividing ratio designation data, comprising:

first divider means having a first dividing ratio responsive to a first signal in one dividing cycle, for dividing a second signal coupled to a signal input thereof and providing a third signal at an output thereof;

second divider means having a second dividing ratio responsive to said dividing ratio designation data, and having a signal input coupled to the output of said first divider means so as to receive the third signal therefrom, for dividing said third signal and providing at signal output thereof, fourth and fifth signals, the fifth signal being provided earlier in time than the fourth signal; and pulse interval extender means for extending the pulse interval of an input signal corresponding to said second signal, which input signal is processed in said first divider means, the pulse interval extension of the pulse interval extender means being determined by the dividing ratio designation data, receiving said fifth signal from said second divider means to provide a timing reference, and providing said first signal to said first divider means, said first signal including pulse interval extension data which is a function of the dividing ratio designation data and which is synchronized with said fifth signal;

the first and second divider means synthesizing a dividing ratio N expressed by the equation:

$$N = \{N_L - (n-1)\} N_{Hl} + \sum_{i=2}^{n} N_{Hi}$$

where $N_L$ is a dividing ratio of said second divider means, $N_{Hi}$ is a dividing ratio of said first divider means, n is a numerical value that the dividing ratio of said first divider means may take in one dividing cycle, and i is a natural number; term $$\sum_{i=2}^{n} N_{Hi}$$

of said equation being determined by said dividing ratio designation data and said pulse interval extender means;

the dividing ratio designation data comprising n data blocks, and the pulse interval extender means including (a) delay means for providing a sixth signal which is $n-1$ times delayed by one pulse behind said fifth signal and synchronized with said third signal, and (b) a data selection means for supplying a dividing data based on any one of said n data blocks to said first divider means by means of said first signal when said sixth signal is supplied to said selection means.

2. A programmable divider according to claim 1 characterized in that said second divider means includes a programmable down counter presetted by any one of said n data blocks, a numerical value presetted in said down counter, which is presetted for each dividing cycle, being counted down by said third signal, and a count value detector for providing said fifth signal when a count output of said down counter comes to correspond to said number n of data blocks; that said delay circuit is composed of $n-1$ D-type flip-flops series-connected with each other, said $n-1$ D-type flip-flops providing $n-1$ of said sixth signal; and that said data selection means is composed of $n-1$ AND gates which are opended and closed by said sixth signal respectively, and supplied with $n-1$ dividing data out of said data blocks.

3. A programmable divider according to claim 2 wherein said count value detector includes an inverter connected to an output bit of binary codes having a second logic level when a count output of said down counter stands at said binary codes corresponding to the number n of said data blocks, and a logic gate to take the logical product of signals derived from output bits of the count output of said down counter which are not connected to said inverter and a signal derived from the output terminal of said inverter, said fifth signal being delivered from the output terminal of said logic gate.

4. A programmable divider according to claim 2 wherein said count value detector includes an inverter connected to an output bit of binary codes having a second logic level when a count output of said down counter stands at said binary codes corresponding to the number n of said data block, and a logic gate to take the logical product of signals derived from output bits of the count output of said down counter which are not connected to said inverter and a signal derived from the output terminal of said inverter, said fifth signal being delivered from the output terminal of said logic gate.

5. A programmable divider having a dividing ratio that is a function of a dividing ratio designation data, comprising:
   first divider means having a first dividing ratio responsive to a first signal in one dividing cycle, for dividing a second signal coupled to a signal input thereof, and providing a third signal at an output thereof;
   second divider means, having a signal input coupled to the output of said first divider means so as to receive the third signal therefrom, for dividing said third signal in accordance with a second dividing ratio responsive to said dividing ratio designation data and providing at signal outputs thereof, fourth and fifth signals, the fifth signal being provided earlier in time than the fourth signal; and
   pulse interval extended means, having a characteristic pulse interval extension of which is determined by the dividing ratio designation data, receiving said fifth signal from said second divider means to provide a timing reference, and providing said first signal to said first divider means, said first signal including pulse interval extension data which is a function of the dividing ratio designation data and has a timing based upon said fifth signal,
   the pulse interval extension means including a delay means for providing a sixth signal which is delayed by at least one pulse behind said fifth signal and which is synchronized with said third signal, and a pulse pick-up means for picking up a number of pulses based on said dividing ratio designation data from said first divider means by means of said first signal when said sixth signal is supplied to said pick-up means.

6. A programmable divider according to claim 5 wherein said delay means comprises a D-type flip-flop.

7. A programmable divider according to claim 5 wherein said first divider means comprises one or more dividers, and wherein said pulse pick-up means comprises pulse pick-up circuits coupled respectively to said dividers, the timing for pulse pick-up of each of said pulse pick-up circuits being determined in accordance with said third or sixth signal.

8. A programmable divider according to claim 7 wherein said one or more dividers comprises series-connected binary counters.

9. A programmable divider according to claim 7 wherein said pulse pick-up circuit includes a first D-type flip-flop having a D-input terminal supplied with a seventh signal for determining a timing for pulse pick-up, a clock input terminal supplied with an eighth signal for which pulse pick-up is made, and an output terminal providing a ninth signal;
   a second D-type flip-flop having a D-input terminal supplied with said ninth signal, a clock input terminal supplied with said eighth signal, and an inverted output terminal providing a tenth signal;
   a first NAND gate having a first input terminal supplied with said ninth signal, a second input terminal supplied with said tenth signal, a third input terminal supplied with an eleventh signal for deciding whether or not to make pulse pick-up, and an output terminal providing a twelfth signal;
   a first inverter having an input terminal supplied with said eighth signal and an output terminal providing a thirteenth signal having a phase opposite to that of said eighth signal; and
   a second NAND gate having a first input terminal supplied with said twelfth signal, a second input terminal supplied with said thirteenth signal, and an output terminal providing a fourteenth signal;
   said fourteenth signal having the same number of pulses as said eighth signal while said eleventh signal is at a first logic level, the number of pules of said fourteenth signal being smaller than that of said eighth signal by one during a period of time when said seventh signal is at a second logic level while said eleventh signal is at said second logic level.

10. A programmable divider according to claim 9 wherein said pulse pick-up circuit includes a third D-type flip-flop having a D-input terminal supplied with a fifteenth signal for determining a timing for pulse pick-up, a clock input terminal supplied with a sixteenth signal for which pulse pick-up is made, and an output terminal providing a seventeenth signal;
   a fourth D-type flip-flop having a D-input terminal supplied with said seventeenth signal, a clock input terminal supplied with said sixteenth signal, an output terminal providing an eighteenth signal, and an inverted output terminal providing a nineteenth signal;
   a fifth D-type flip-flop having a D-input terminal supplied with said eighteenth signal, a clock input terminal supplied with said sixteenth signal, and an inverted output terminal providing a twentieth signal;
   a first AND gate having a first input terminal supplied with said seventeenth signal, a second input terminal supplied with said nineteenth signal, and an output terminal providing a twenty-first signal;
   a second AND gate having a first input terminal supplied with said eighteenth signal, a second input terminal supplied with said twentieth signal, a third input terminal supplied with a twenty-second signal for determining a number of pulses to be picked up, and an output terminal providing a twenty-third signal;
   a first NOR gate having a first input terminal supplied with said twenty-first signal, a second input terminal supplied with said twenty-third signal, and an output terminal providing a twenty-fourth signal;
   a second inverter having an input terminal supplied with said sixteenth signal and an output terminal providing a twenty-fifth signal having a phase opposite to that of said sixteenth signal; and
   a third NAND gate having a first input terminal supplied with said twenty-fourth signal, a second input terminal supplied with said twenty-fifth signal, and an output terminal providing a twenty-sixth signal;
   the number of pulses of said twenty-sixth signal being smaller than that of said sixteenth signal by one while said twenty-second signal is at a first logic level, the number of pulses of said twenty-sixth signal being smaller than that of said sixteenth signal by two during a period of time when said fifteenth signal is at a second logic level while said twenty-second signal is at said second logic level.

11. A programmable divider according to claim 10 wherein said pulse pick-up circuit includes a sixth D-type flip-flop having a D-input terminal supplied with a twenty-seventh signal for determining a timing for pulse pick-up, a clock input terminal supplied with a twenty-eighth signal for which pulse pick-up is made, and an output terminal providing a twenty-ninth signal;
  a seventh D-type flip-flop having a D-input terminal supplied with said twenty-ninth signal, a clock input terminal supplied with said twenty-eighth signal, an output terminal providing a thirtieth signal, and an inverted output terminal providing a thirty-first signal;
  an eighth D-type flip-flop having a D-input terminal supplied with said thirtieth signal, a clock input terminal supplied with said twenty-eighth signal, and an inverted output terminal providing a thirty-second signal; a third AND gate having a first input terminal supplied with said twenty-ninth signal, a second input terminal supplied with said thirty-first signal, a third input terminal supplied with a thirty-third signal for determining a number of pulses to be picked up, and having an output terminal providing a thirty-fourth signal;
  a fourth AND gate having a first input terminal supplied with said thirtieth signal, a second input terminal supplied with said thirty-second signal, a third input terminal supplied with a thirty-fifth signal for determining a number of pulses to be picked up, and an output terminal providing a thirty-sixth signal;
  a second NOR gate having a first input terminal supplied with said thirty-fourth signal, a second input terminal supplied with said thirty-sixth signal, and an output terminal providing a thirty-seventh signal;
  a third inverter having an input terminal supplied with said twenty-eighth signal and an output terminal providing a thirty-eighth signal having a phase opposite to that of said twenty-eighth signal; and
  a fourth NAND gate having a first input terminal supplied with said thirty-seventh signal, a second input terminal supplied with said thirty-eighth signal, and an output terminal providing a thirty-ninth signal;
  said thirty-ninth signal having the same number of pulses as that of said twenty-eighth signal while said thirty-third and thirty-fifth signals are both at a first logic level, the number of pulses of said thirty-ninth signal being smaller than that of said twenty-eighth signal by one during a period of time when said twenty-seventh signal is at a second logic level while said thirty-third and thirty-fifth signals are at said second and first logic levels respectively, the number of pulses of said thirty-ninth signal being smaller than that of said twenty-eighth signal by two while said thirty-third and thirty-fifth signals are both at said second logic level.

12. A programmable divider having a dividing ratio that is a function of dividing ratio designation data coupled thereto, comprising:
  first divider means having a first dividing ratio responsive to a first signal in one dividing cycle, for dividing a second signal coupled thereto and providing a third signal at an output thereof;
  second divider means having a signal input coupled to the output of the first divider means for dividing said third signal in accordance with a second dividing ratio responsive to said dividing ratio designation data and providing a divided fourth signal and a fifth signal produced earlier than said fourth signal; and
  pulse interval extender means, having a characteristic pulse interval extension determined by said dividing ratio designation data, said pulse interval extender means being supplied with said fifth signal controlling the timing for pulse interval extending operation thereof, for supplying said first divider means with said first signal which includes pulse interval extension data based on said dividing ratio designation data and has a timing controlled by said fifth signal;
  the dividing ratio N, of the programmable divider, synthesized by said first and second divider means being expressed by the equation:

$$N = \{N_L - (n-1)\} N_{HI} + \sum_{i=2}^{n} N_{Hi}$$

where $N_L$ is the dividing ratio of said second divider means, $N_{Hi}$ is the dividing ratio of said first divider means, n is a numerical value that the dividing ratio of said first divider means may take in one dividing cycle, and i is a natural number; the term $$\sum_{i=2}^{n} N_{Hi}$$

of said equation being determined by said dividing ratio designation data and said pulse interval extender means;
  the dividing ratio designation data comprising n data blocks, and the pulse interval extender means including (a) delay means for providing a sixth signal which is $n-1$ times delayed by one pulse behind said fifth signal and synchronized with said third signal, and (b) data selection means for supplying a dividing data based on any one of said n data blocks to said first divider means by means of said first signal when said sixth signal is supplied to said selection means.

13. A programmable divider according to claim 12 wherein said second divider means includes a programmable down counter presettable by any one of said n data blocks, a numerical value preset in said down counter, which is preset for each dividing cycle, being counted down by said third signal, and a count value detector for providing said fifth signal when a count output of said down counter comes to correspond to said number n of data blocks; said delay circuit comprising $n-1$ D-type flip-flops series-connected with each other, said $n-1$ D-type flip-flops providing $n-1$ of said sixth signal; and said data selection means comprising $n-1$ AND gates which are opened and closed by said sixth signal respectively, and supplied with $n-1$ dividing data out of said data blocks.

14. A programmable divider the dividing ratio of which is changed by a dividing ratio designation data comprising:
  first divider means having a first dividing ratio changeable in accordance with a first signal in one dividing cycle for dividing a second signal coupled thereto and providing a third signal;
  second divider means having a second dividing ratio determined by said dividing ratio designation data for dividing said third signal from said first divider means and providing a divided fourth signal and a fifth signal produced earlier than said fourth signal; and pulse interval extender means the pulse interval extension of which is determined by said dividing ratio designation data, said pulse interval extender means being supplied with said fifth signal, for providing timing for pulse interval extending operation thereof, and supplying said first divider means with said first signal which includes a pulse interval extension data based on said dividing ratio designation data and has a timing synchronized with said fifth signal wherein said pulse interval extender means includes delay means for providing a sixth signal which is delayed by at least one pulse behind said fifth signal and is synchronized with said third signal, and pulse pick-up means for picking up a number of pulses based on said dividing ratio designation data from said first divider means by means of said first signal when said sixth signal is supplied to said pick-up means.

15. A programmable divider according to claim 14 wherein said delay means comprises of a D-type flip-flop.

16. A programmable divider according to claim 14 wherein said first divider means comprises one or more dividers, and said pulse pick-up means is composed of pulse pick-up circuits coupled respectively to said dividers, timing for pulse pick-up of each of said pulse pick-up circuits being determined in accordance with said third or sixth signal.

17. A programmable divider according to claim 16 wherein said one or more dividers comprises series-connected binary counters.

18. A programmable divider according to claim 16 wherein said pulse pick-up circuit includes a first D-type flip-flop whose D-input terminal is supplied with a seventh signal for determining a timing for pulse pick-up, whose clock input terminal is supplied with an eight signal for which pulse pick-up is made, and whose output terminal delivers a ninth signal;

a second D-type flip-flop whose D-input terminal is supplied with said ninth signal, whose clock input terminal is supplied with said eighth signal, and whose inverted output terminal delivers a tenth signal;

a first NAND gate whose first input terminal is supplied with said ninth signal, whose second input terminal is supplied with said tenth signal, whose third input terminal is supplied with an eleventh signal for deciding whether or not to make pulse pick-up, and whose output terminal delivers a twelfth signal;

a first inverter whose input terminal is supplied with said eighth signal and whose output terminal delivers a thirteenth signal of a phase opposite to that of said eighth signal; and a second NAND gate whose first input terminal is supplied with said twelfth signal, whose second input terminal is supplied with said thirteenth signal, and whose output terminal delivers a fourteenth signal;

and said fourteenth signal having the same number of pulses with said eighth signal while said eleventh signal is at a first logic level, the number of pulses of said fourteenth signal being smaller than that of said eighth signal by one during a period of time when said seventh signal is at a second logic level while said eleventh signal is at said second logic level.

19. A programmable divider according to claim 16 wherein said pulse pick-up circuit includes a third D-type flip-flop whose D-type terminal is supplied with a fifteenth signal for determining a timing for pulse pick-up, whose clock input terminal is supplied with a sixteenth signal for which pulse pick-up is made, and whose output terminal delivers a seventeenth signal;

a fourth D-type flip-flop whose D-input terminal is supplied with said seventeenth signal, whose clock input terminal is supplied with said sixteenth signal, whose output terminal delivers an eighteenth signal, and whose inverted output terminal delivers a nineteenth signal;

a fifth D-type flip-flop whose D-input terminal is supplied with said eighteenth signal, whose clock input terminal is supplied with said sixteenth signal, and whose inverted output terminal delivers a twentieth signal;

a first AND gate whose first input terminal is supplied with said seventeenth signal, whose second input terminal is supplied with said nineteenth signal, and whose output terminal delivers a twenty-first signal;

a second AND gate whose first input terminal is supplied with said eighteenth signal, whose second input terminal is supplied with said twentieth signal, whose third input terminal is supplied with a twenty-second signal for determining a number of pulses to be picked up, and whose output terminal delivers a twenty-third signal;

a first NOR gate whose first input terminal is supplied with said twenty-first signal, whose second input terminal is supplied with said twenty-third signal, and whose output terminal delivers a twenty-fourth signal;

a second inverter whose input terminal is supplied with said sixteenth signal and whose output terminal delivers a twenty-fifth signal of a phase opposite to that of said sixteenth signal; and a third NAND gate whose first input terminal is supplied with said twenty-fourth signal, whose second input terminal is supplied with said twenty-fifth signal, and whose output terminal delivers a twenty-sixth signal;

and the number of pulses of said twenty-sixth signal being smaller than that of said sixteenth signal by one while said twenty-second signal is at a first logic level, the number of pulses of said twenty-sixth signal being smaller than that of said sixteenth signal by two during a period of time when said fifteenth signal is at a second logic level while said twenty-second signal is at said second logic level.

20. A programmable divider according to claim 16 wherein said pulse pick-up circuit includes a sixth D-type flip-flop whose D-input terminal is supplied with a twenty-seventh signal for determining a timing for pulse pick-up, whose clock input terminal is supplied with a twenty-eighth signal for which pulse pick-up is made, and whose output terminal delivers a twenty-ninth signal;

a seventh D-type flip-flop whose D-input terminal is supplied with said twenty-ninth signal, whose clock input terminal is supplied with said twenty-eighth signal, whose output terminal delivers a thirtieth signal, and whose inverted output terminal delivers a thirty-first signal;

an eighth D-type flip-flop whose D-input terminal is supplied with said thirtieth signal, whose clock input terminal is supplied with said twenty-eighth signal, and whose inverted output terminal delivers a thirty-second signal; a third AND gate whose first input terminal is supplied with said twenty-ninth signal, whose second input terminal is supplied with said thirty-first signal, whose third input terminal is supplied with a thirty-third signal for determining a number of pulses to be picked up, and whose output terminal delivers a thirty-fourth signal;

a fourth AND gate whose first input terminal is supplied with said thirtieth signal, whose second input terminal is supplied with said thirty-second signal, whose third input terminal is supplied with a thirty-fifth signal for determining a number of pulses to be picked up, and whose output terminal delivers a thirty-sixth signal;

a second NOR gate whose first input terminal is supplied with said thirty-fourth signal, whose second input terminal is supplied with said thirty-sixth signal, and whose output terminal delivers a thirty-seventh signal; a third inverter whose input terminal is supplied with said twenty-eighth signal and whose output terminal delivers a thirty-eighth signal of a phase opposite to that of said twenty-eighth signal; and a fourth NAND gate whose first input terminal is supplied with said thirty-seventh signal, whose second input terminal is supplied with said thirty-eighth signal, and whose output terminal delivers a thirty-ninth signal;

and said thirty-ninth signal having the same number of pulses with said twenty-eighth signal while said thirty-third and thirty-fifth signals are both at a first logic level, the number of pulses of said thirty-ninth signal being smaller than that of said twenty-eighth signal by one during a period of time when said twenty-seventh signal is at a second logic level while said thirty-third and thirty-fifth signals are at said second and first logic levels respectively, the number of pulses of said thirty-ninth signal being smaller than that of said twenty-eighth signal by two while said thirty-third and thirty-fifth signals are both at said second logic level.

* * * * *